(12) United States Patent
Katakam et al.

(10) Patent No.: US 12,484,296 B2
(45) Date of Patent: Nov. 25, 2025

(54) FORK SHEET DEVICE WITH WRAPPED SOURCE AND DRAIN CONTACT TO PREVENT NFET TO PFET CONTACT SHORTAGE IN A TIGHT SPACE

(71) Applicant: INTERNATIONAL BUSINESS MACHINES CORPORATION, Armonk, NY (US)

(72) Inventors: Shravana Kumar Katakam, Lehi, UT (US); Tao Li, Slingerlands, NY (US); Indira Seshadri, Niskayuna, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 443 days.

(21) Appl. No.: 18/145,003

(22) Filed: Dec. 21, 2022

(65) Prior Publication Data
US 2024/0213243 A1 Jun. 27, 2024

(51) Int. Cl.
*H10D 84/85* (2025.01)
*H01L 23/50* (2006.01)
*H01L 23/522* (2006.01)
*H10D 30/01* (2025.01)
*H10D 62/13* (2025.01)

(52) U.S. Cl.
CPC ............ *H10D 84/85* (2025.01); *H01L 23/50* (2013.01); *H01L 23/5226* (2013.01); *H10D 30/021* (2025.01); *H10D 62/151* (2025.01)

(58) Field of Classification Search
CPC .... H10D 84/85; H10D 62/151; H10D 30/021; H01L 23/50; H01L 23/5226

USPC ......................................................... 257/368
See application file for complete search history.

(56) References Cited

U.S. PATENT DOCUMENTS

| | | |
|---|---|---|
| 8,901,607 B2 | 12/2014 | Wang et al. |
| 9,570,395 B1 | 2/2017 | Sengupta et al. |
| 10,586,765 B2 | 3/2020 | Smith et al. |
| 10,636,739 B2 | 4/2020 | Beyne et al. |
| 10,700,207 B2 | 6/2020 | Chen et al. |
| 10,734,224 B2 | 8/2020 | Smith et al. |
| 11,133,254 B2 | 9/2021 | Lai et al. |
| 11,335,606 B2 | 5/2022 | Yang et al. |
| 11,411,100 B2 | 8/2022 | Wang et al. |

(Continued)

OTHER PUBLICATIONS

Gupta, A. et al., "Buried Power Rail Integration With FinFETs for Ultimate CMOS Scaling"; IEEE Transactions on Electron Devices (2020); vol. 67:12, pp. 5349-5354.

(Continued)

*Primary Examiner* — Tu-Tu V Ho
(74) *Attorney, Agent, or Firm* — Samuel A. Waldbaum

(57) ABSTRACT

A microelectronic device includes a first source and drain structure adjacent to a second source and drain structure. A first conductive contact is in contact with a top surface and side surface of the first source and drain structure. A second conductive contact is in contact with a top surface and side surface of the second source and drain structure. The second conductive contact includes a via extension to connect to a backside component. A separating layer is located between the first conductive contact and the second conductive contact. A first sidewall of the separating layer is flush with the first conductive contact. A second sidewall of the separating layer is flush with the second conductive contact.

19 Claims, 23 Drawing Sheets

(56) References Cited

U.S. PATENT DOCUMENTS

| | | |
|---|---|---|
| 2020/0075574 A1 | 3/2020 | Smith et al. |
| 2021/0111115 A1* | 4/2021 | Morrow et al. |
| 2021/0336063 A1* | 10/2021 | Liao .................. H01L 23/5286 |
| 2021/0375861 A1* | 12/2021 | Chung .................. H10D 88/00 |
| 2022/0093595 A1 | 3/2022 | Pan et al. |
| 2022/0223698 A1 | 7/2022 | Xie et al. |

OTHER PUBLICATIONS

Gupta, A. et al., "Buried Power Rail Metal exploration towards the 1 nm Node", IEEE (2021), 4 pgs.

Gupta, A. et al., "Buried Power Rail Integration for CMOS Scaling Beyond the 3 nm Node", Proceedings of SPIE (2022), 6 pgs.

Veloso, A. et al., "Scaled FinFETs Connected by Using Both Wafer Sides for Routing via Buried Power Rails"; IEEE (2022), 2 pgs.

\* cited by examiner

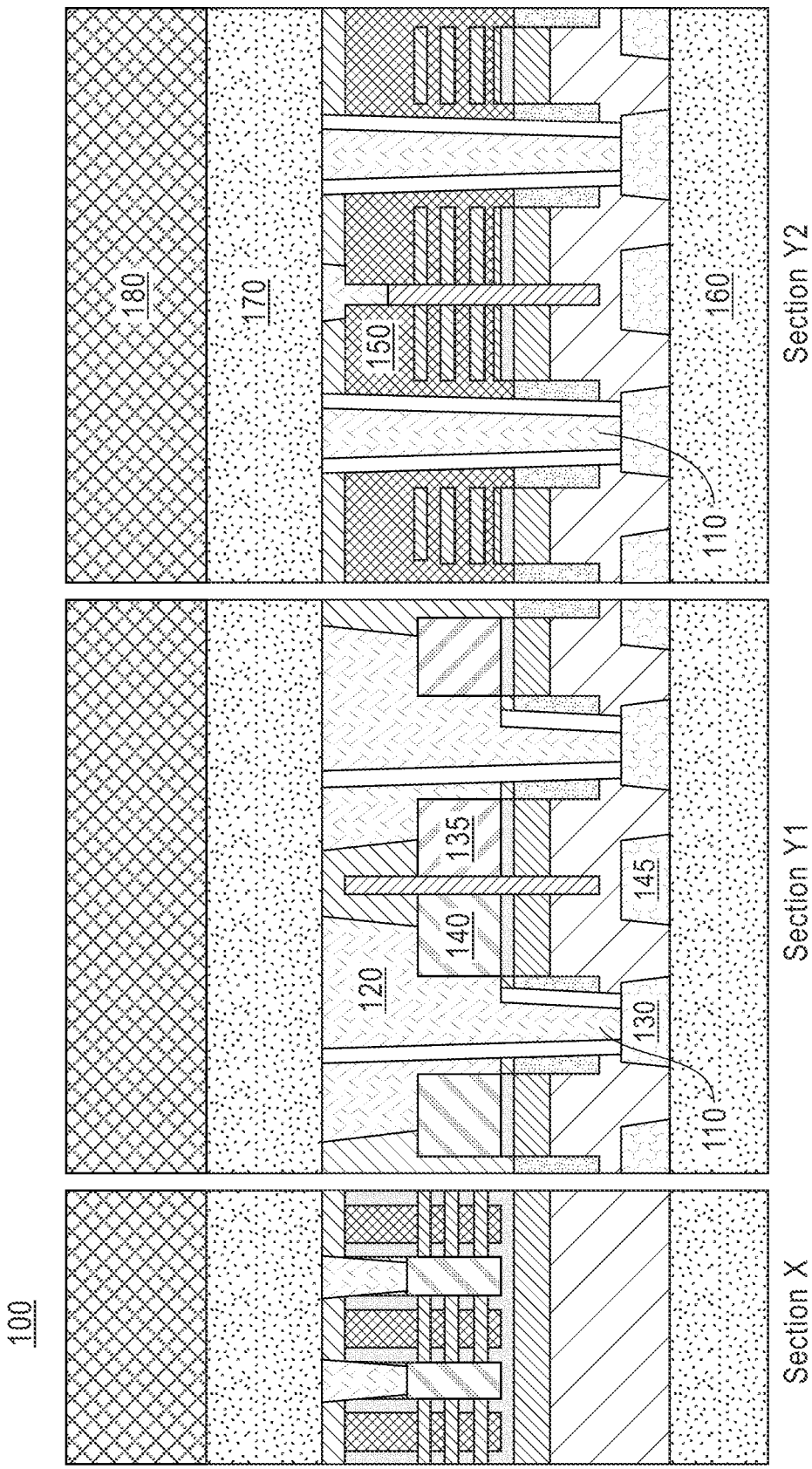

Section Y1

Section Y1

Section Y1

Section Y1

Section Y1

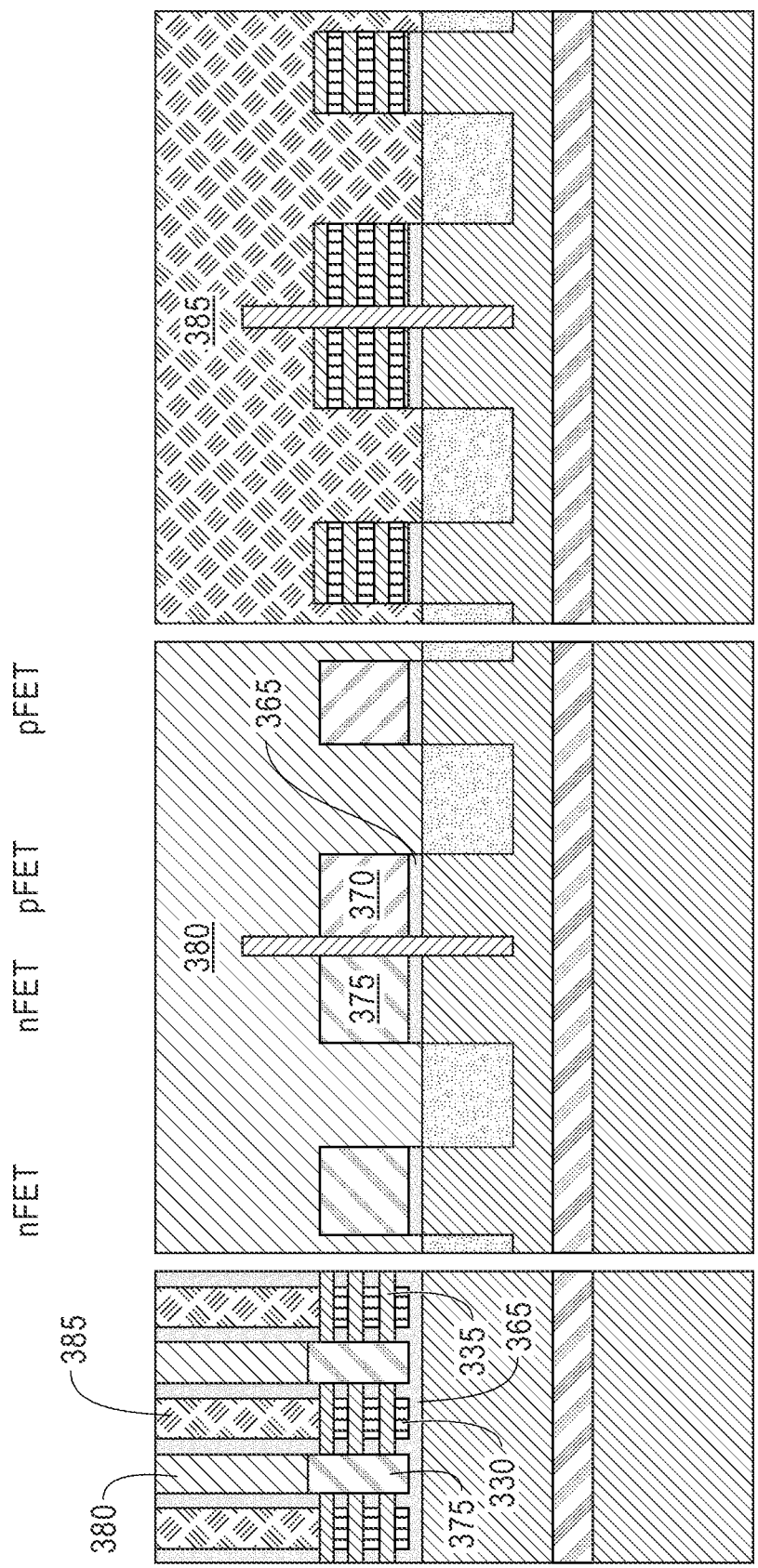

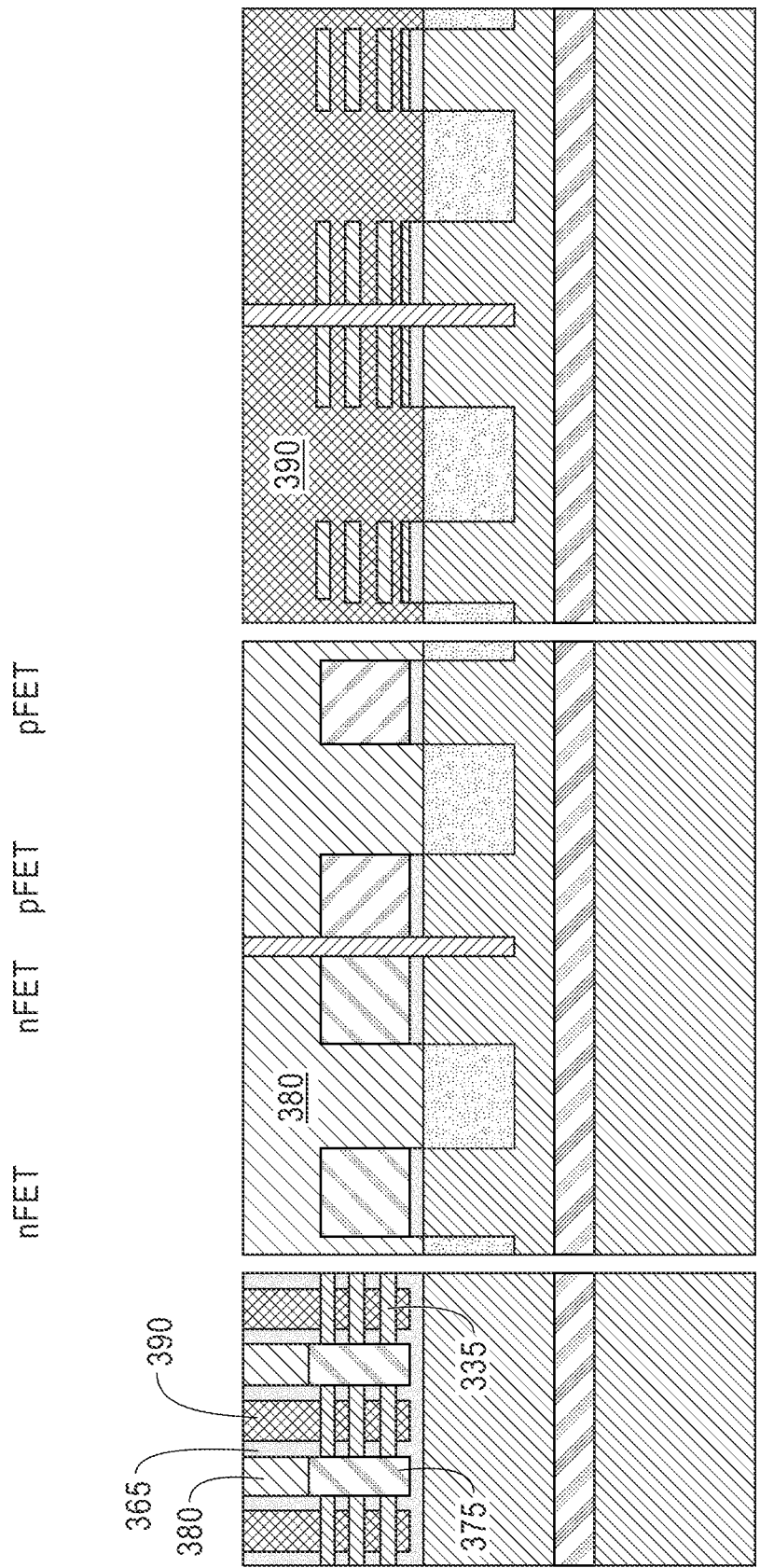

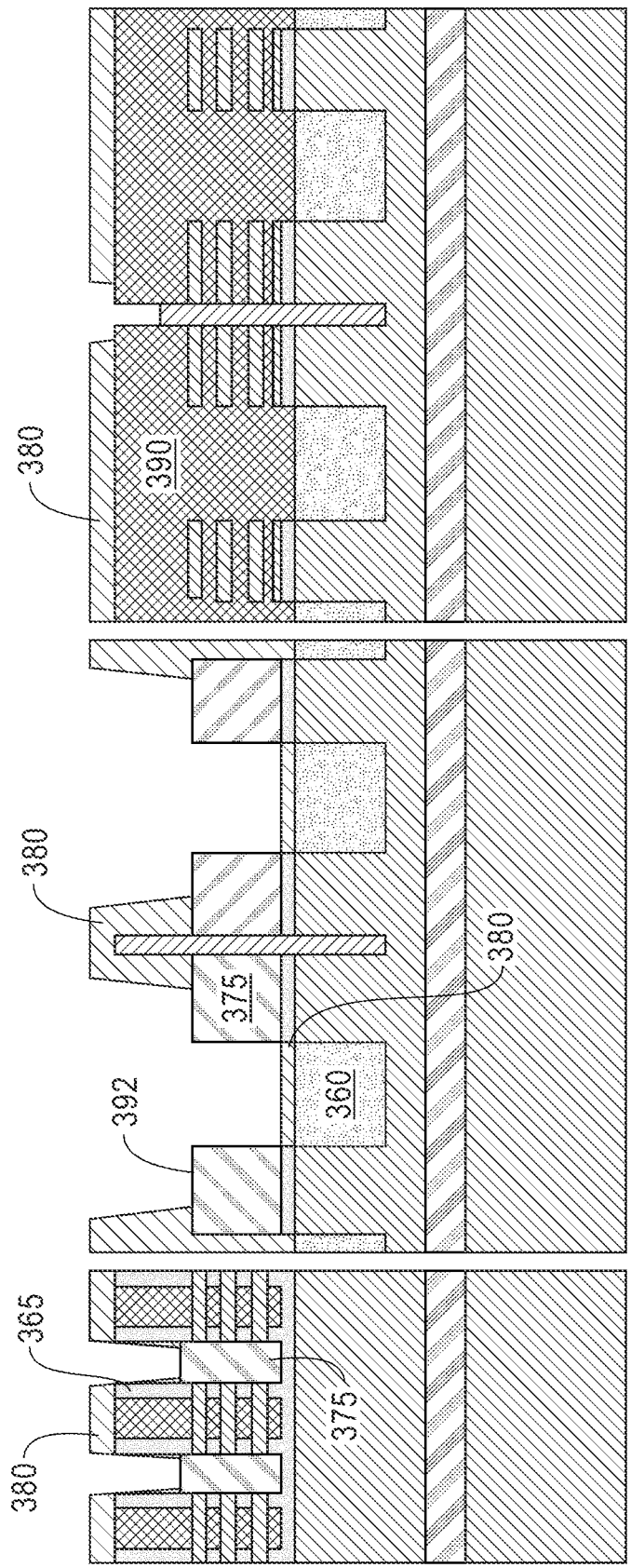

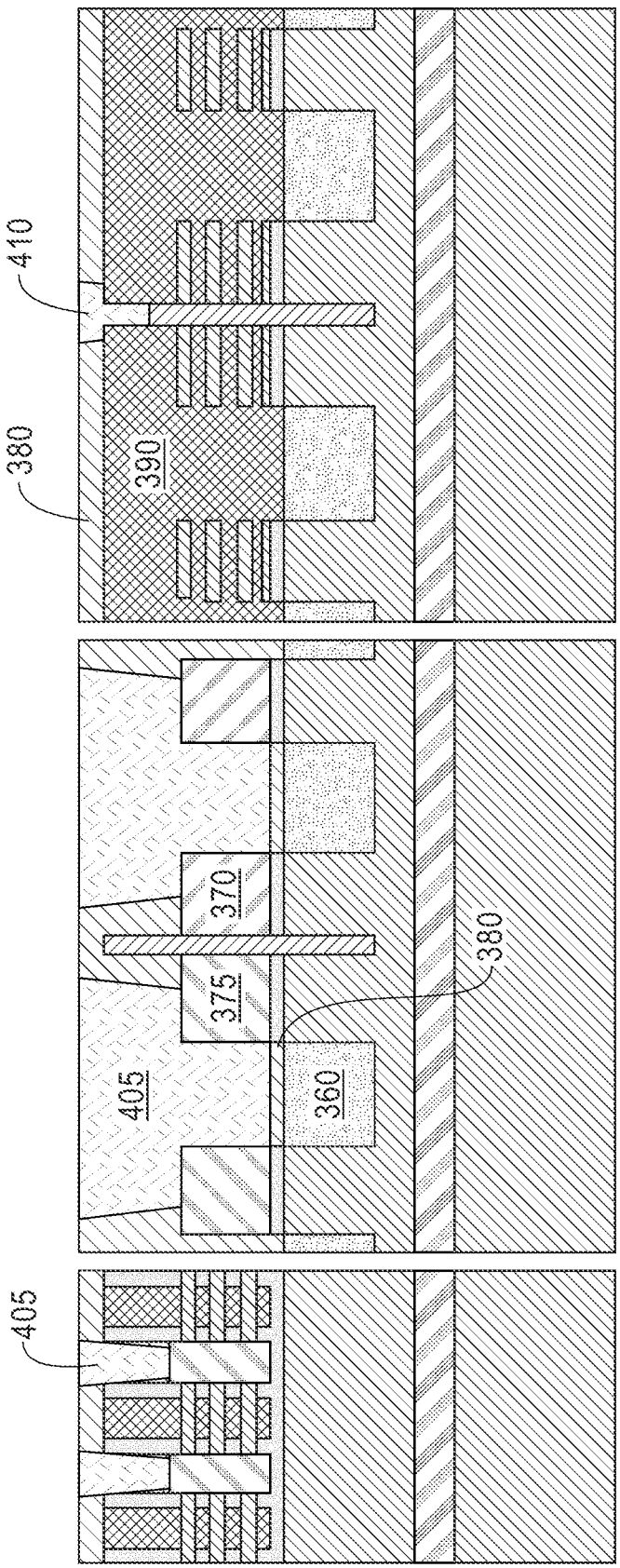

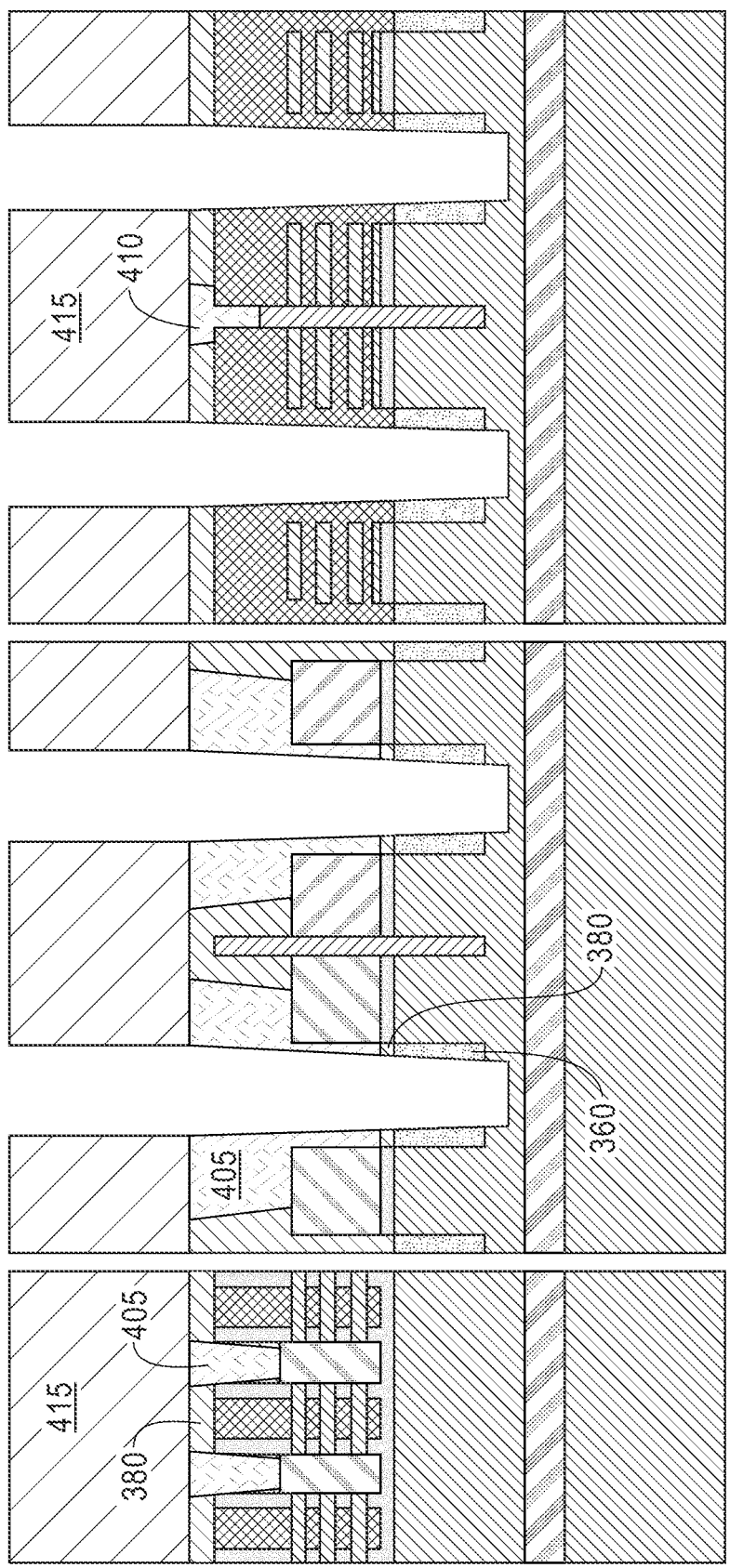

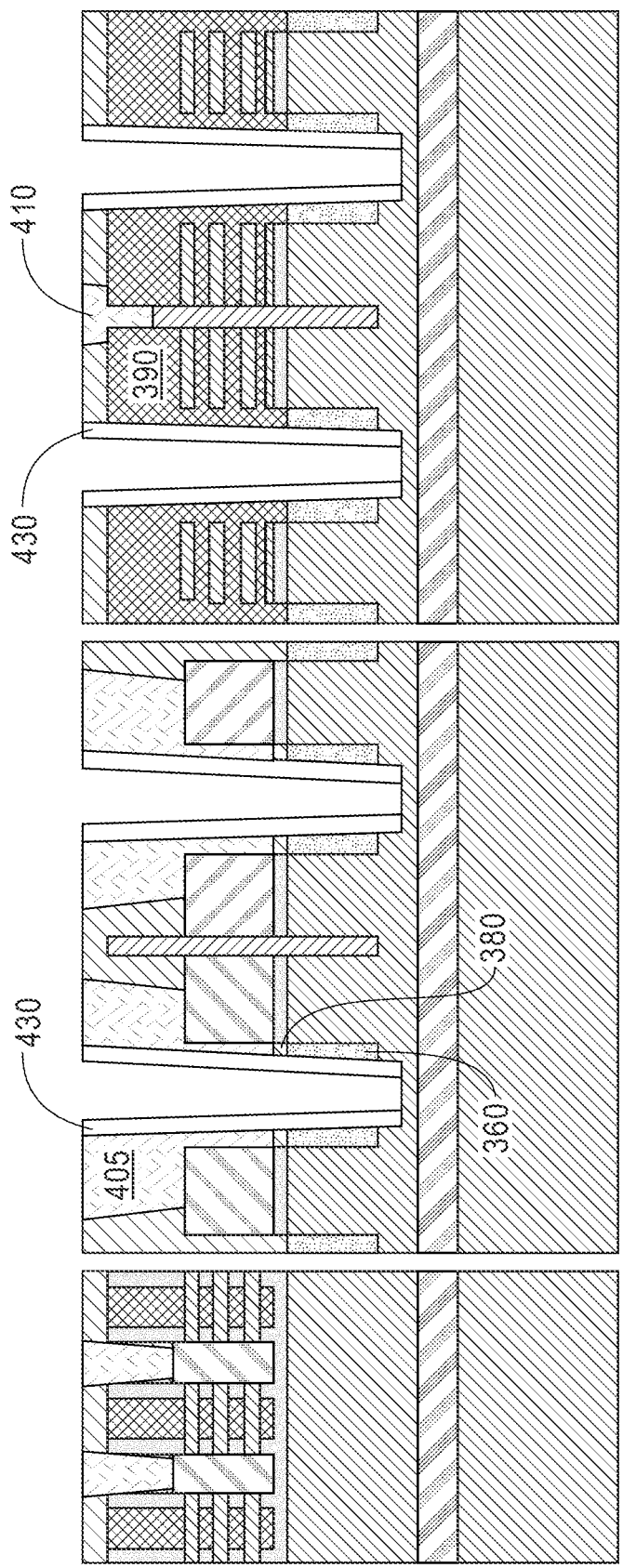

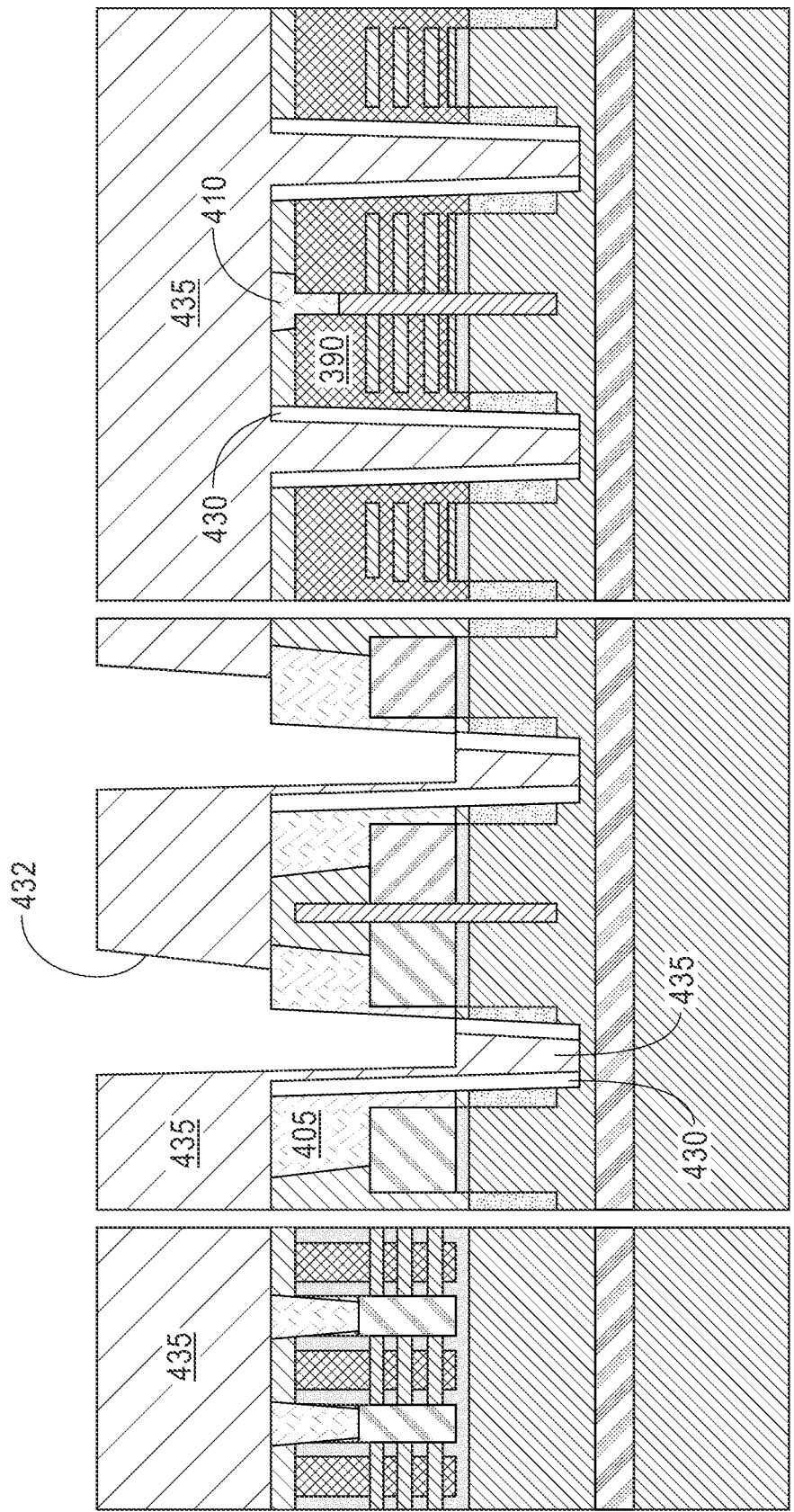
FIG. 16A Section X
FIG. 16B Section Y1
FIG. 16C Section Y2

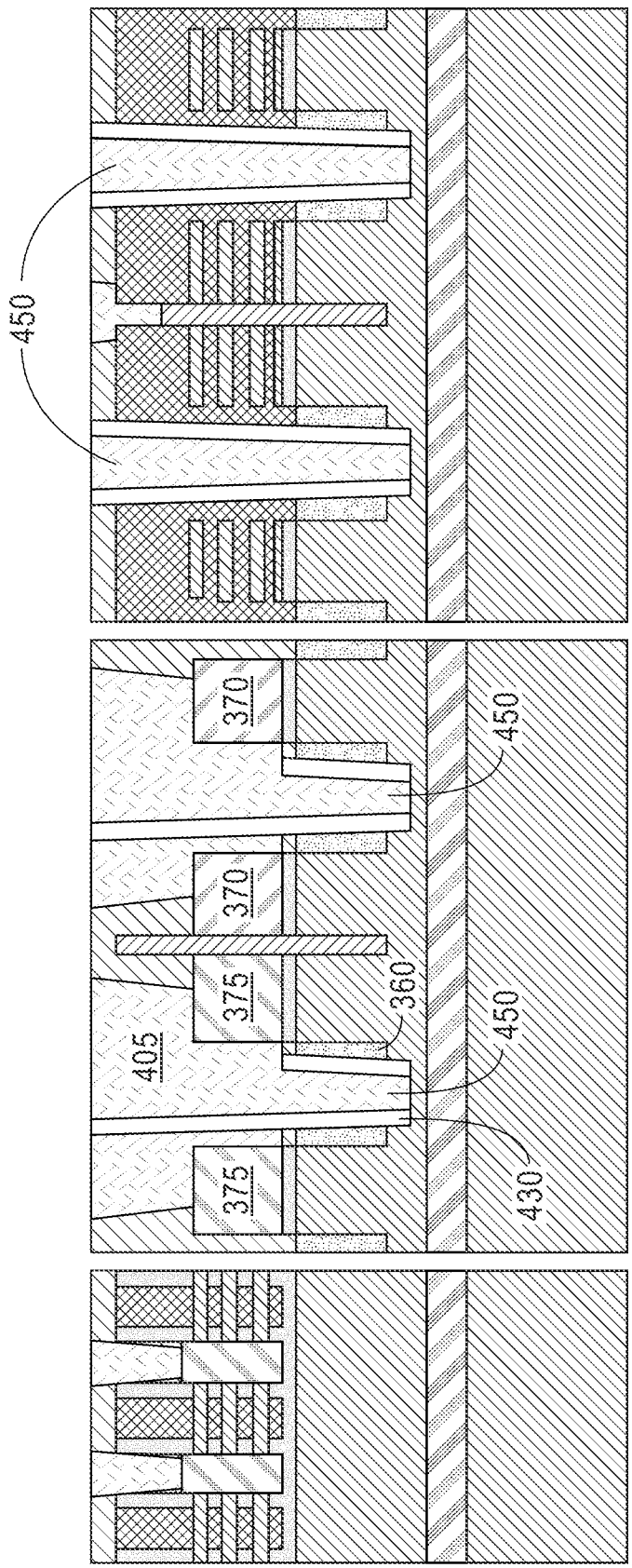

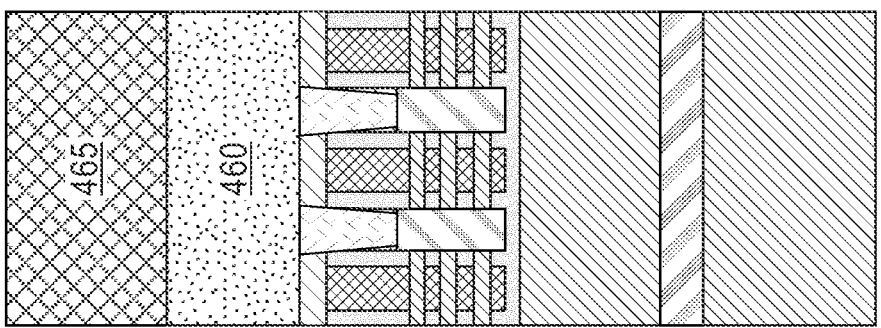
FIG. 18A Section X
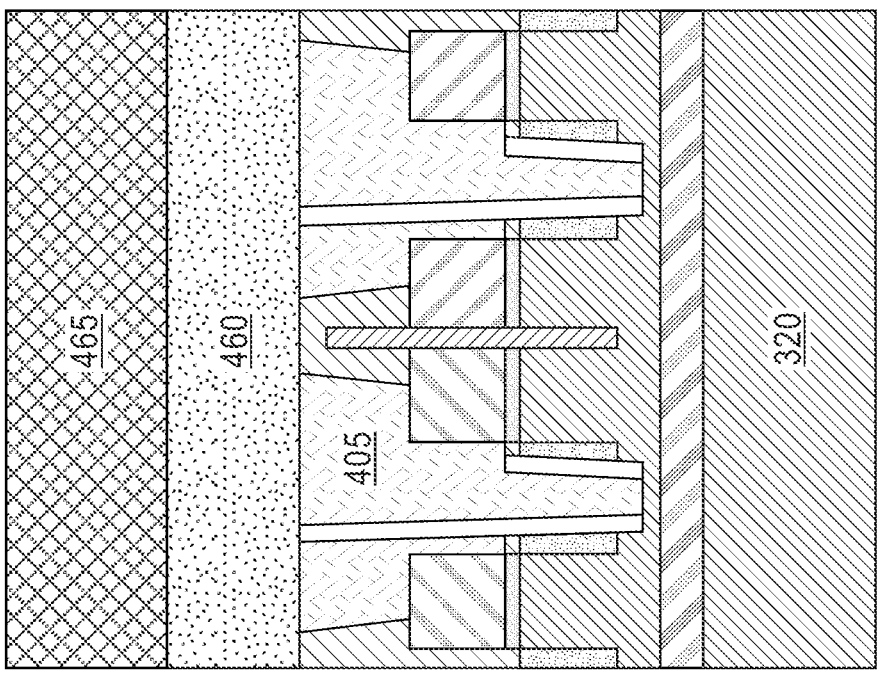
FIG. 18B Section Y1
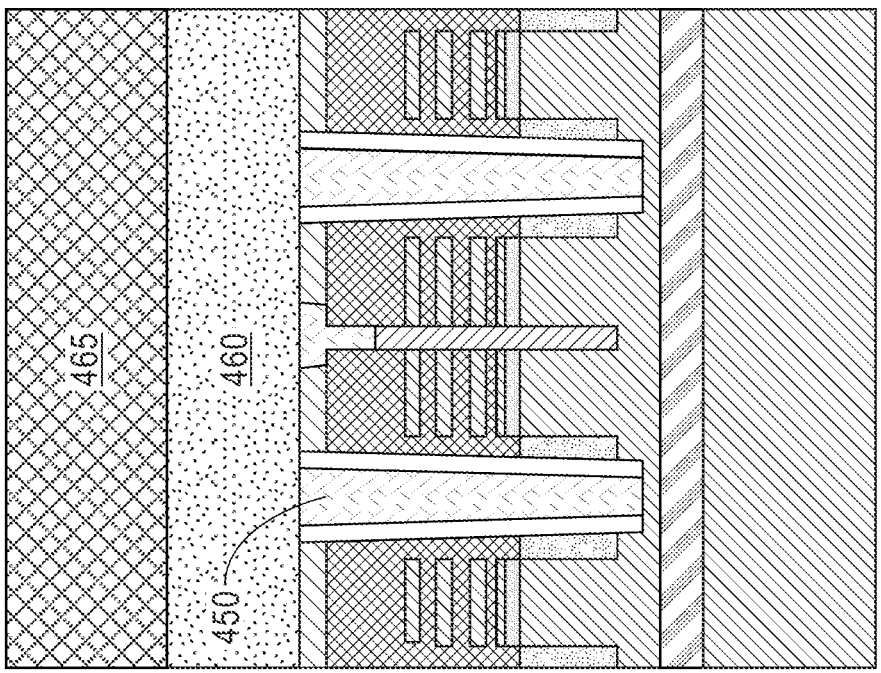
FIG. 18C Section Y2

Section X  Section Y1  Section Y2

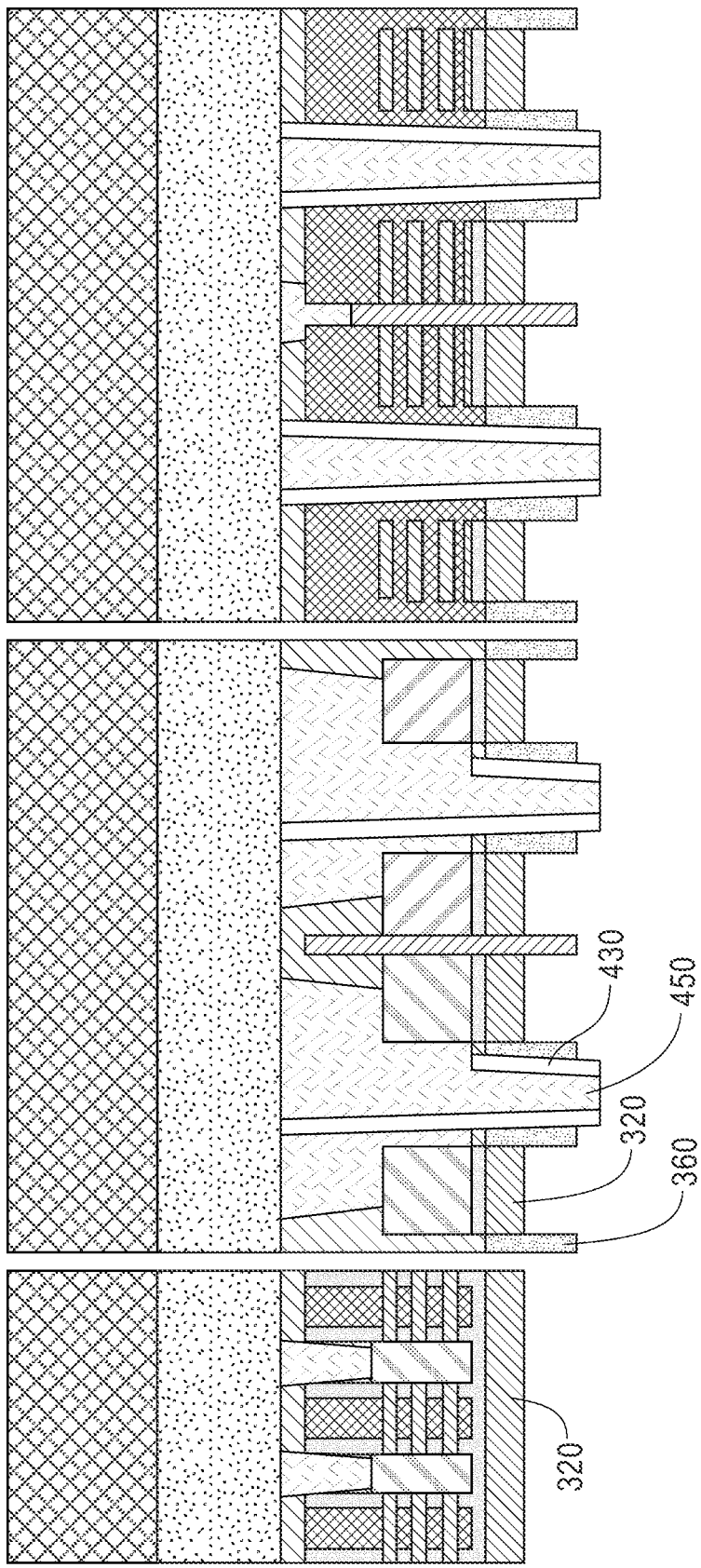
FIG. 20A  Section X
FIG. 20B  Section Y1
FIG. 20C  Section Y2

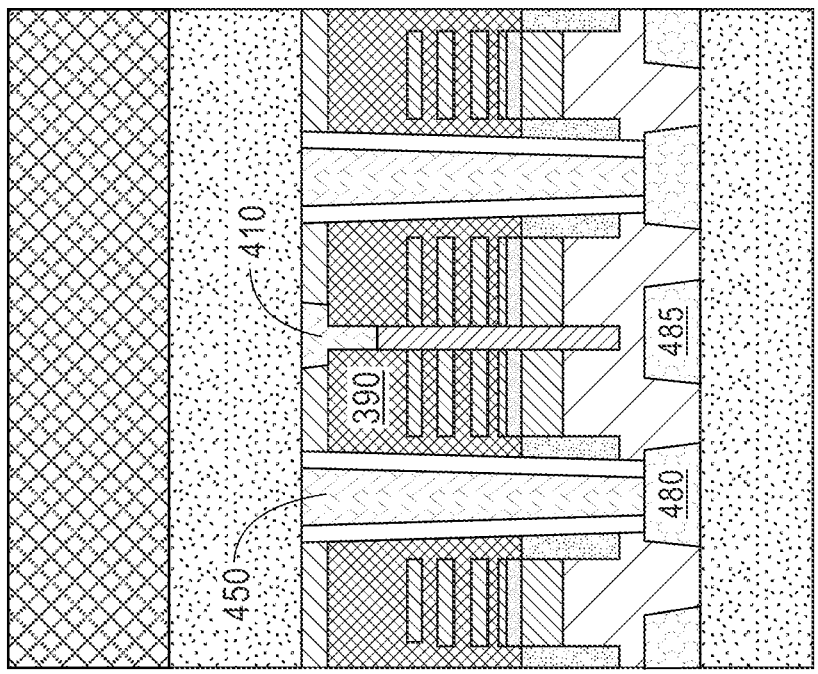
FIG. 21C  Section Y2
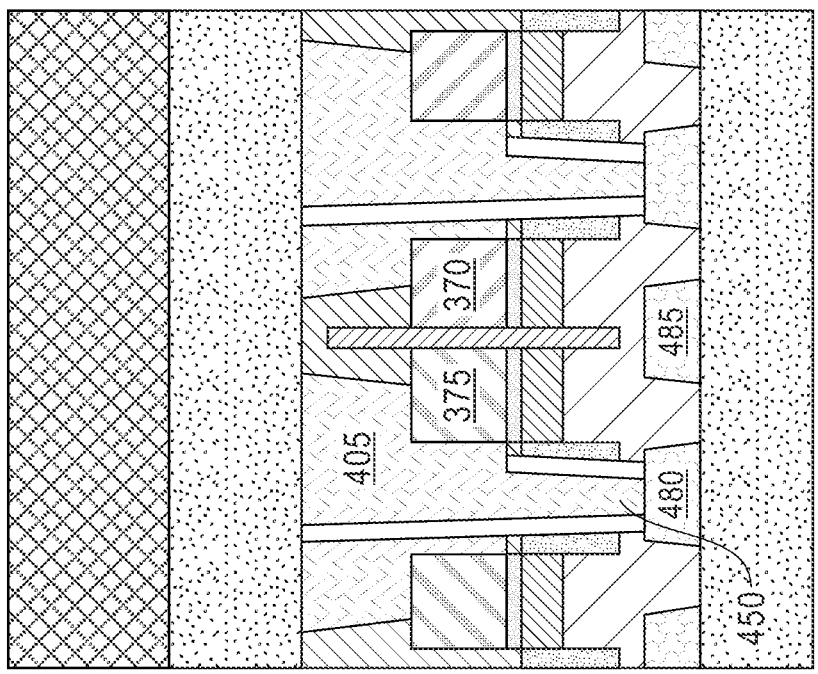
FIG. 21B  Section Y1
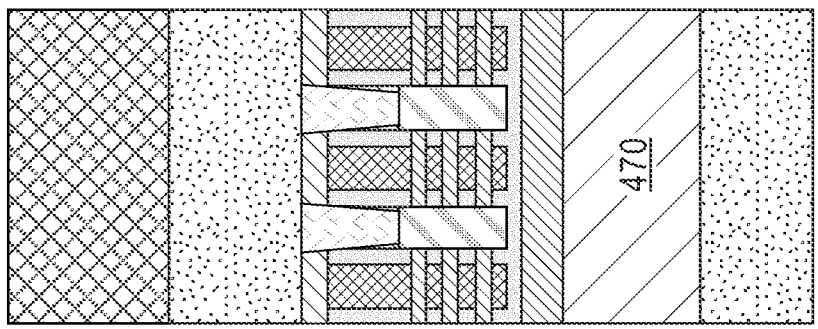
FIG. 21A  Section X

FORK SHEET DEVICE WITH WRAPPED SOURCE AND DRAIN CONTACT TO PREVENT NFET TO PFET CONTACT SHORTAGE IN A TIGHT SPACE

BACKGROUND

Technical Field

The present disclosure generally relates to electrical devices, and more particularly, to a fork sheet device with wrapped source and drain contact to prevent NFET to PFET contact shortage in a tight space.

Description of the Related Art

In semiconductor device manufacture, conventional methods use front side contact schemes. In front side contact schemes, front side formed power vias are used to connect front side power access to internal electronic structures.

Some technologies are moving to backside formed devices. Back side power delivery is becoming an area of interest for next technology nodes. The ever-tighter spaces to work with present several challenges in microelectronic feature fabrication.

SUMMARY

According to an embodiment of the present disclosure, a microelectronic device is provided. The device includes a first source and drain structure adjacent to a second source and drain structure. A first conductive contact is in contact with a top surface and side surface of the first source and drain structure. A second conductive contact is in contact with a top surface and side surface of the second source and drain structure. The second conductive contact includes a via extension to connect to a backside component. A separating layer is located between the first conductive contact and the second conductive contact. A first sidewall of the separating layer is flush with the first conductive contact. A second sidewall of the separating layer is flush with the second conductive contact.

According to another embodiment of the present disclosure, a semiconductor chip device is provided. The semiconductor device includes a middle of line layer. A back end of line layer is coupled to a front side of the middle of line layer. A backside power delivery network is coupled to a back side of the middle of line layer. A power rail is in the backside power delivery network. A fork sheet FET is positioned in the middle of line layer, including a first source and drain structure adjacent to a second source and drain structure. A first conductive contact is in contact with the first source and drain structure and with the back end of line layer. A power bar is in the middle of line layer in contact with the first conductive contact and with the power rail in the backside power delivery network.

According to another embodiment of the present disclosure, a method of manufacturing a semiconductor device is provided. The method includes forming, from a semiconductor substrate, a pair of field effect transistors (FETs). A dielectric separation layer is formed in between the FETs. A gate region is formed proximate the pair of FETs. A power bar is formed in contact with a first of the FETs in a middle of line layer of the semiconductor device. A first conductive contact is formed in contact with the power bar from a front side of the middle of line layer. A power rail is formed in contact with the power bar, on a back side of the middle of line layer. A back side power delivery network is formed on the back side of the middle of line layer.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIGS. 1A-1C show cross-sectional views of a semiconductor device according to an embodiment of the present disclosure.

FIGS. 10A-10C show views of forming source and drain regions and gate patterning, according to an embodiment.

FIGS. 11A-11C show views forming a gate region, according to an embodiment.

FIGS. 12A-12C show views of patterning a middle of line layer, according to an embodiment.

FIGS. 13A-13C show views of depositing metal contact features, according to an embodiment.

FIGS. 14A-14C show views forming cuts into the formation shown in FIGS. 13A-13C, according to an embodiment.

FIGS. 15A-15C show views of adding a liner to cut areas shown in FIGS. 14A-14C, according to an embodiment.

FIGS. 16A-16C show views of patterning a via back side power rail, according to an embodiment.

FIGS. 17A-17C show views of forming a power bar in the formation shown in the views of FIGS. 16A-16C, according to an embodiment.

FIGS. 18A-18C show views forming a back end of line layer and a carrier wafer, according to an embodiment.

FIGS. 20A-20C show views after removal of an etch stop layer and a recessing of a substrate, according to an embodiment.

FIGS. 21A-21C show views forming back side power rails and a back side power delivery network, according to an embodiment.

DETAILED DESCRIPTION

Overview

Figure 1D:
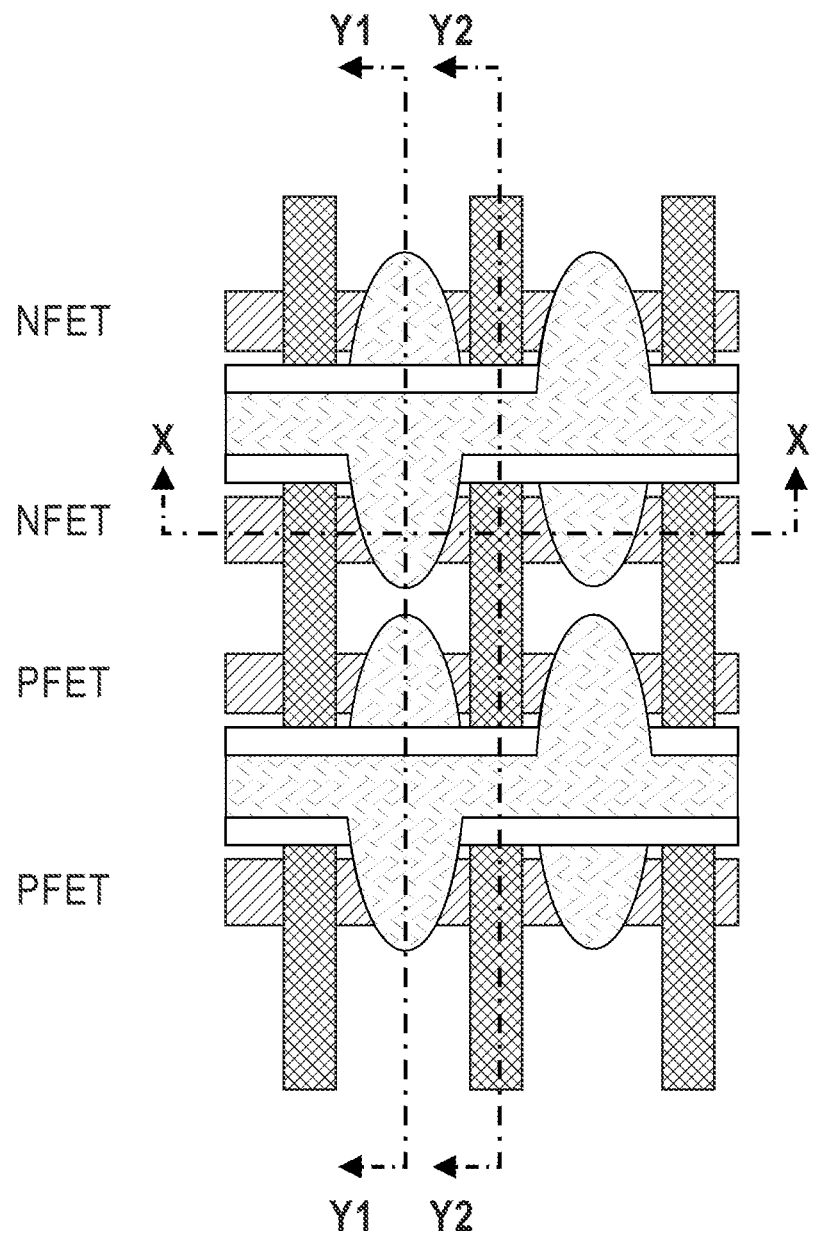
FIG. 1D is a legend showing axes from a top view perspective of the device of FIGS. 1A-1C, consistent with embodiments of the present disclosure.

Embodiments of the semiconductor device technology disclosed herein address fabrication structures and techniques in microelectronics. In advanced nodes with NFET to NFET (N2N) and PFET to PFET (P2P) structures, the space between the NFET to NFET or PFET to PFET is approximately in the 40 nm range. In conventional microelectronic structures, for the pitches in these ranges, front side vias is much smaller (at approximately 8 nm in diameter). As a conductive via in such a small size, a signal travelling through the via encounters high resistance. Additionally, the aspect ratio of the via is high, adding additional complexity from a patterning perspective in this scale.

Embodiments of the subject technology generally reduce the distance between adjacent NFET and PFET pillars (sometimes known as the "N2P" space) of a pair of FETs in a fork sheet device. Some features may also reduce resistance along signal lines between the front side of a middle of line layer and the back side of a middle of line layer. For example, some embodiments include a power rail instead of an open via which reduces the resistance. In addition, the conductive contact profile is configured to increase the conductive area available to a signal while reducing the gap in the N2P space. As another benefit, the aspect ratio of the contact area is reduced by using a power rail.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Some embodiments use nanosheet structures. Nanosheets are typically able to maintain DC performance due to an adequate effective gate width, but AC performance is challenging because of the relatively large parasitic capacitance between the source/drain contact and gate. Cell height scaling difficulties are another issue, due to gate stack patterning challenges associated with tall nanosheet stacks. Tall nanosheet stacks are desirable, however, because they provide the same effective length at a smaller footprint, directly enabling area scaling.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. Similarly, an element described as "on top of" of another element may mean either that the element is positioned above and is not necessarily in direct contact with the underlying element. The device may be otherwise oriented (rotated 90 degrees or viewed or referenced at other directions) and the spatially relative descriptors used herein should be interpreted accordingly.

As used herein, the terms "lateral", "planar", and "horizontal" describe an orientation parallel to a first surface of a chip or substrate. In the disclosure herein, the "first surface" may be the top layer of a semiconductor device where individual circuit devices are patterned in the semiconductor material.

As used herein, the term "vertical" describes an orientation that is arranged perpendicular to the first surface of a chip, chip carrier, chip substrate, or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together. The phrase "electrically connected" does not necessarily mean that the elements must be directly in physical contact together—intervening elements may be provided between the "connected" or "electrically connected" elements.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. Nor does describing an element as "first" or "second", etc. necessarily mean that there is an order or priority to any of the elements. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope. It should be appreciated that the figures and/or drawings accompanying this disclosure are exemplary, non-limiting, and not necessarily drawn to scale.

It is to be understood that other embodiments may be used, and structural or logical changes may be made without departing from the spirit and scope defined by the claims. The description of the embodiments is not limiting. In particular, elements of the embodiments described hereinafter may be combined with elements of different embodiments.

Definitions

Middle of Line (MOL) Layer: The middle of line layer MOL is a section of a semiconductor device that includes active and/or passive electrical components including for example, transistor and interconnect pieces connected together using a series of contact structures.

Back End of Line (BEOL): The back end of line is a layer of integrated circuit fabrication where the individual electronic components become interconnected with wiring on a wafer or other substrate. In embodiments below, the BEOL may be shown placed on the "front side" of a layer of electrical components.

Back Side Power Delivery Network (BSPDN): A back side power delivery network is a layer of connections connecting electrical components from the back side of their layer or support structure. In embodiments disclosed below, the BSPDN may be on a side of the MOL opposite the BEOL.

Substrate: Reference to a substrate may refer to material that provides a support structure to features in or on top of the substrate material. As used below, there may be more than one substrate present in an embodiment shown. Also, since embodiments below are generally shown in cross-section, it should be understood that a substrate for a layer with patterned features may not be visible in the view so as to highlight the features for the layer.

Example Device Structure

Referring now to FIGS. 1A-1D, a cross-sectional view of a semiconductor device 100 (referred to generally as the "device 100") is shown, consistent with embodiments of the disclosure. In some embodiments, the device 100 is a microelectronics device. As will be seen below, the embodiment shown in FIGS. 1A-1C is representative of a final result of a method of fabrication consistent with embodiments of the subject disclosure. FIG. 1D is a legend providing the various views of the semiconductor device during the fabrication process. In general, the legend shows a top view of the device as the formation process evolves. The "X" axis is a cross-section taken along an n-type FET, source and drain region. The "Y1" axis is a cross-section taken along a perspective that is transverse to the X axis, across source and drain regions of two FETS and a line of metal contacts. The "Y2" axis is a cross-section taken along a perspective that is through a gate region and parallel to the Y1 axis. The "A" series of figures is shown along the X axis throughout the disclosure. Similarly, the "B" series of figures show formation as seen through the Y1 axis. The "C" series of figures show formation from the Y2 axis perspective. FIGS. 3-9 (which are single views during an initial formation of the device) all show a perspective from the Y1 axis.

The device 100 generally includes a fork sheet FET structure in the middle of line (MOL) layer. In one embodiment, the MOL includes a p-type FET, source drain structure 135 and an n-type FET, source drain structure 140 arranged (e.g., cooperate) as a fork sheet FET. A gate region 150 may be proximate the source and drain structures 135 and 140. Some embodiments include a back side power delivery network (BSPDN) 160 coupled to a back side surface of the MOL. Some embodiments include a back end of line (BEOL) layer 170 coupled to a front side of the MOL. Some embodiments may include a carrier wafer 180 coupled to the top side of the BEOL 170.

A conductive contact 120 may be positioned in contact with one of the source and drain structures 135 or 140. In the example shown, the conductive contact 120 is positioned so that the metal of the conductive contact 120 is flush against a side wall and/or a top surface of the n-type FET, source drain structure 140. A separating layer, (for example, a dielectric 380 introduced below in FIGS. 10A and 10B), may have a side wall that is flush against the conductive contact 120 of the source and drain structure 140 and another side wall that is flush against the conductive contact of the source and drain structure 135.

A power bar 110 extends downward in the MOL, from the conductive contact 120 down into connection with a power rail 130 on the back side of the MOL. The power bar 110 may be a solid structure of metal that may be the same material or different than the material for the conductive contact 120. The power bar 110 (in contrast to a power via) provides a drop in resistance between the front side and back side of the MOL since there is more contact area available for a signal to travel through.

In some embodiments, the conductive contact 120 wraps around the source and drain structure 140 adding more performance gains by further increasing the signal contact area available. In some embodiments, the conductive contact 120 for only one of the source and drain structures may be connected to a power bar 110, while the conductive contact for the other source and drain structure of a FET pair may connect the source and drain structure only to a top surface of the MOL. As can be seen by the drawing, the conductive contact 120 connected to the power bar 110 may have a larger surface area than the contact for the other FET in a pair.

In the description of the method for fabrication below, one or more substrates may be present at any one stage. Substrates can be the same material or different materials. Substrates can be made of any suitable substrate material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

Example Methodology of Manufacture

In the following, a process describes a general method of forming a semiconductor device that has a power bar connecting the electrical components on the front side of a MOL to a back side delivery structure is shown according to an embodiment. For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Fabrication of device discussed herein can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, a device can be fabricated on one or more substrates (e.g., a silicon (Si) substrates, and/or another substrate) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, and/or another photoresist technique), etching techniques (e.g., reactive ion etching (RIE), dry etching, wet etching, ion beam etching, plasma etching, laser ablation, and/or another etching technique), evaporation techniques, sputtering techniques, plasma ashing techniques, thermal treatments (e.g., rapid thermal anneal, furnace anneals, thermal oxidation, and/or another thermal treatment), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

Figure 2:
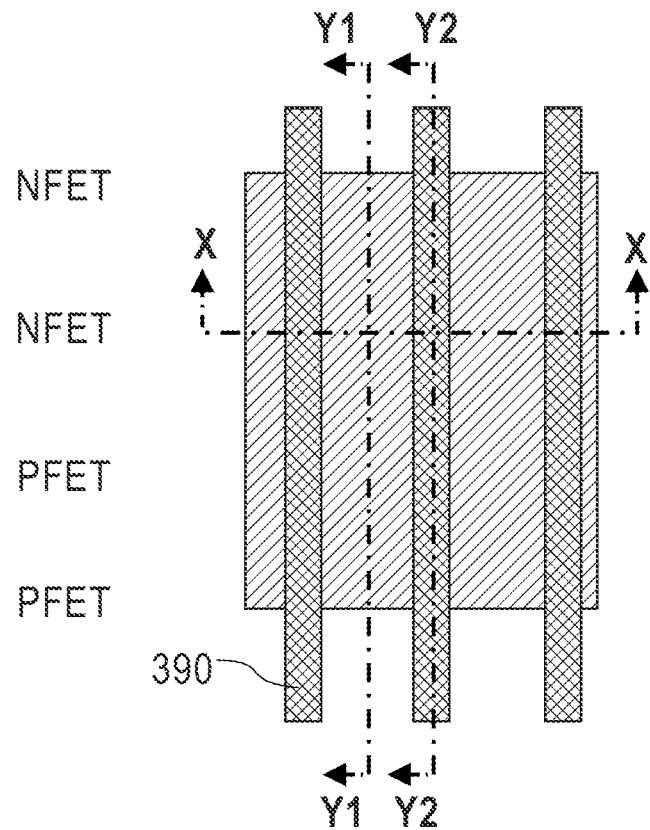
FIG. 2 is a legend showing axes from a top view perspective of an initial substrate formation, consistent with embodiments of the present disclosure.

FIG. 2 shows a legend similar to the legend shown in FIG. 1D except that the legend in FIG. 2 is based on the overhead view of a starting substrate. The legend in FIG. 2 may be referenced for each subsequent series of figures during the description of the formation.

Figure 3:
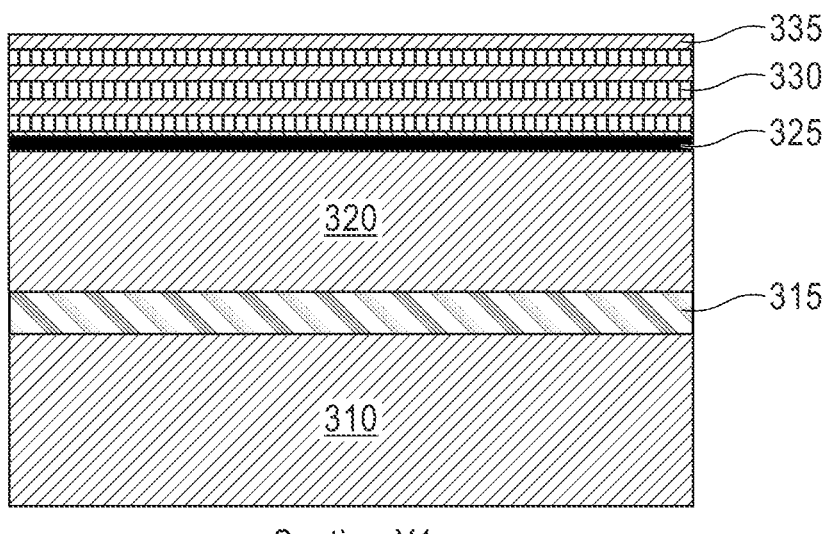
FIG. 3 is a cross-sectional view of a starting substrate formation for a semiconductor device, consistent with embodiments of the present disclosure.

FIG. 3 shows an arbitrary starting substrate formation for a silicon wafer arrangement. The embodiment includes a first substrate layer 310, an etch stop layer 315 on top of the first substrate layer 310, a (e.g., second) substrate layer 320 on top of the etch stop layer 315, a first sacrificial layer 325 on top of the (e.g., second) substrate layer 320, and then a series of layers of semiconductor material 335 and sacrificial layers 330 that alternate in a stack of nanosheets. The first sacrificial layer 325 may be, for example, a layer of silicon germanium. The sacrificial layers 330 may also be silicon germanium but of a different concentration of germanium than the layer 325. The etch stop layer 315 may be, for example, silicon geranium or other suitable etch stop material.

Figure 4:
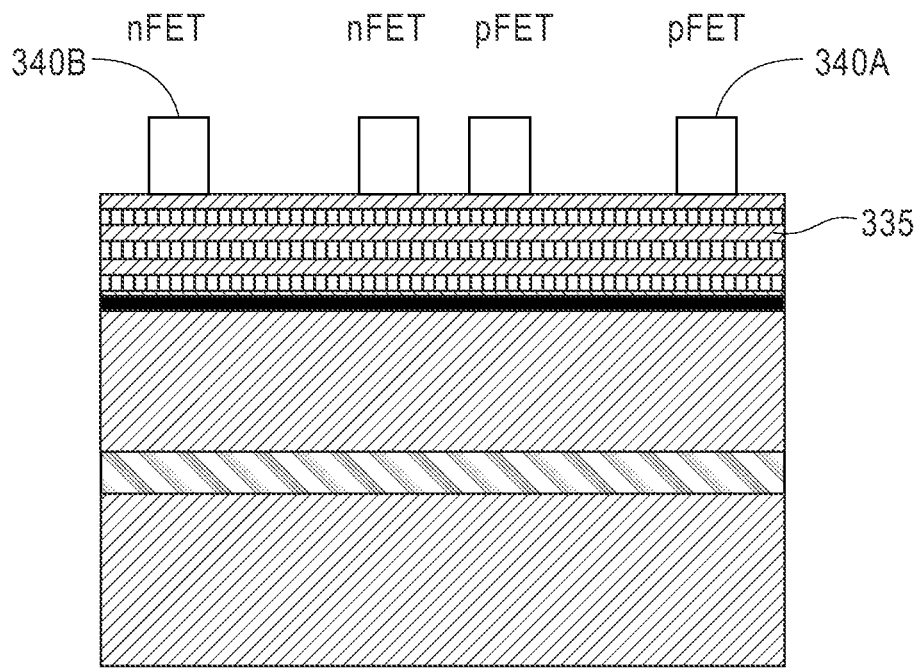
FIG. 4 shows a view of feature patterning on the substrate formation using a hard mask, according to embodiments.

FIG. 4 shows the formation of FIG. 3 after a process of applying a hard mask on top of the highest semiconductor layer of the semiconductor material 335 and patterning the hard mask. Placeholder structures 340A and 340B may be left behind after patterning. The placeholder structure 340A may be reserved for p-type material and the placeholder structure 340B may be reserved for n-type material.

Figure 5:
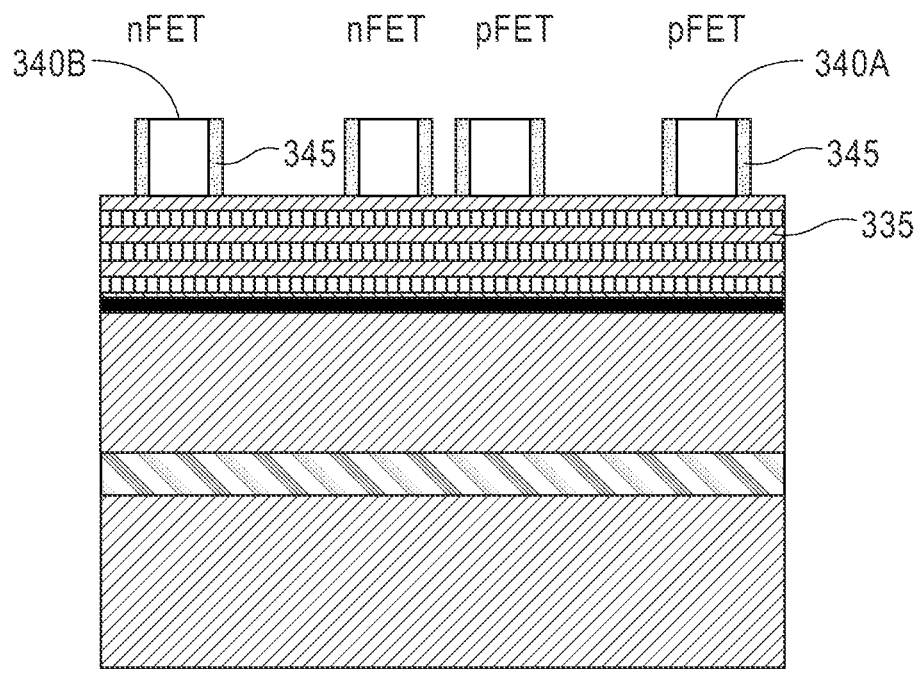
FIG. 5 shows a view of forming a liner spacer on the features of FIG. 4, according to an embodiment.

FIG. 5 shows the formation after applying a liner spacer material 345 on the sides of the placeholder structures 340A and 340B. The liner spacer material 345 layer may be vertical. In some embodiments, the N2P space between the middle two FET placeholder structures may be reduced to 8 nm.

Figure 6:
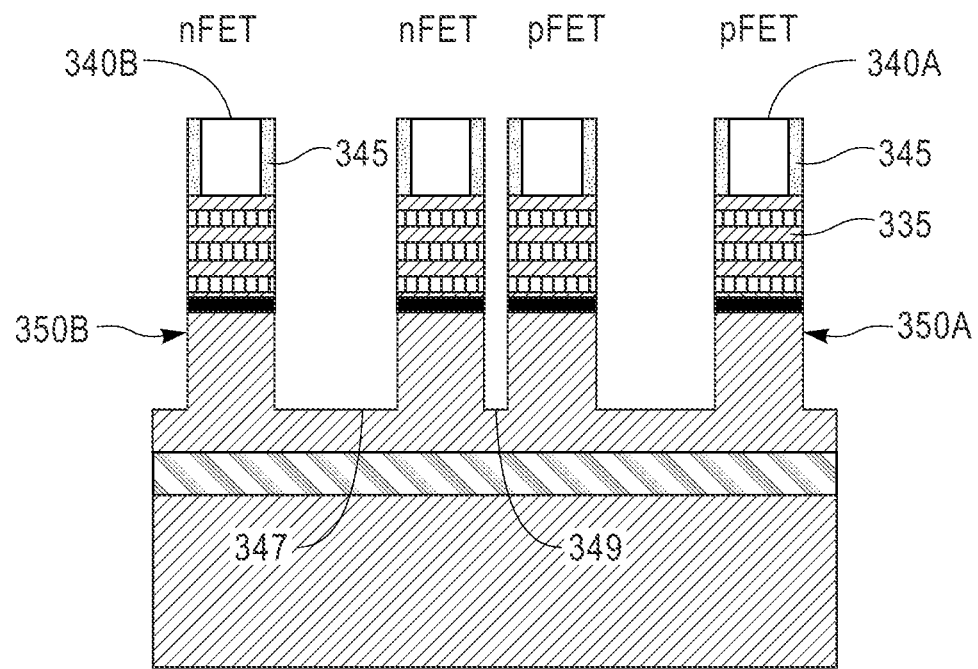
FIG. 6 shows a view of etching nanostack sheets into a fork sheet configuration out of the formation from FIG. 5, according to an embodiment.

FIG. 6 shows a formation after etching down layers of the nanosheets in between the placeholder structures 340A and 340B and etching down into the substrate layer 320 (called out in FIG. 2). The result leaves a trench 347 between adjacent n-type pillars 350B (and similarly between p-type pillars 350A). A trench 349 may be formed in the N2P space between the middle pair of FET structures (p-type pillar 350A and n-type pillar 350B). The result from FIG. 6 is a supporting structure defining a series of fork sheet pillars.

Figure 7:
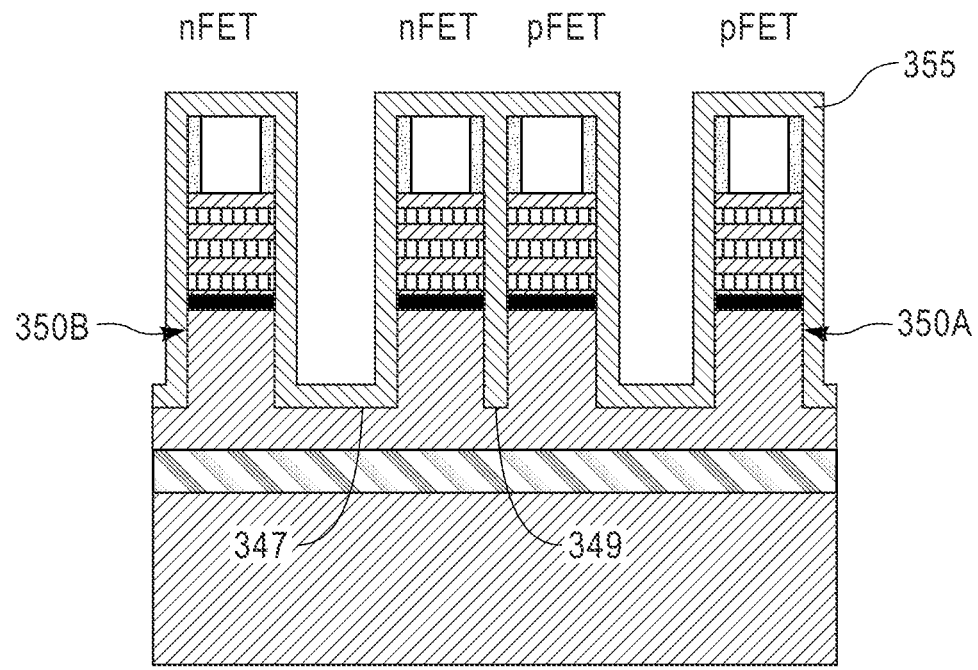
FIG. 7 shows a view depositing a liner over the formation of FIG. 6, according to an embodiment.

FIG. 7 shows a formation after depositing a liner 355 around the pillars 350A and 350B. Some embodiments may use a conformal deposition. The liner 355 may provide the role as a separating layer between the n-type and p-type epitaxial regions of source and drain of respective FETS as will be seen further below. The liner 355 may be a dielectric material (for example, silicon carbide or silicon-oxy-carbide). The liner 355 may cover the top surfaces and the side walls of pillars 350A and 350B, and the trenches 347 and 349.

Figure 8:
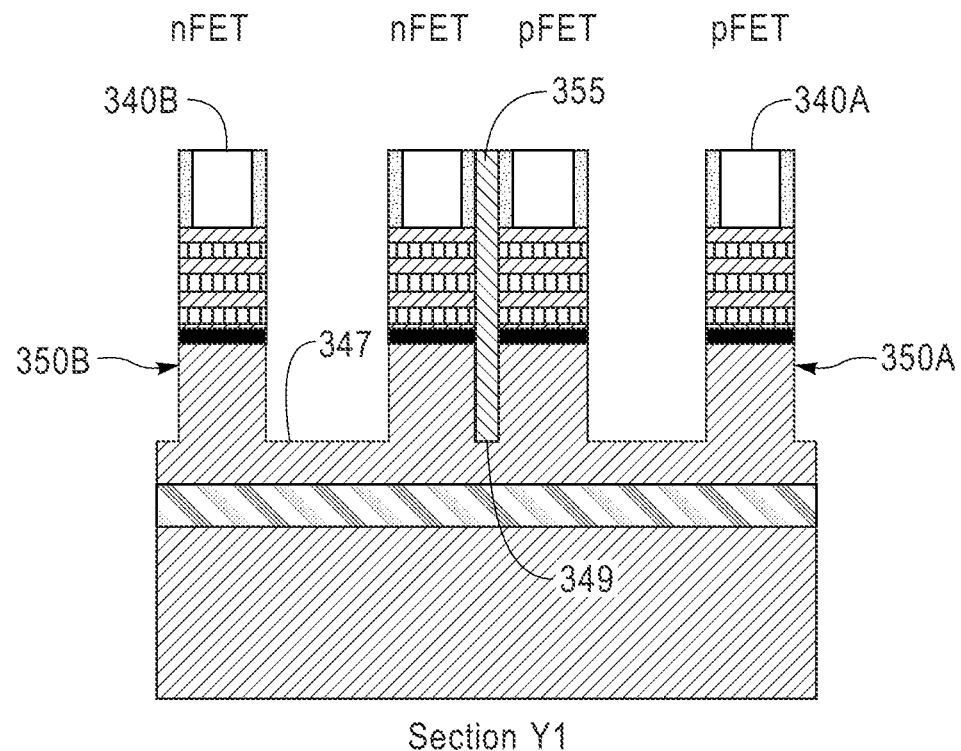
FIG. 8 shows a view of isotropic etching the liner from the formation in FIG. 7, according to an embodiment.
Figure 9:
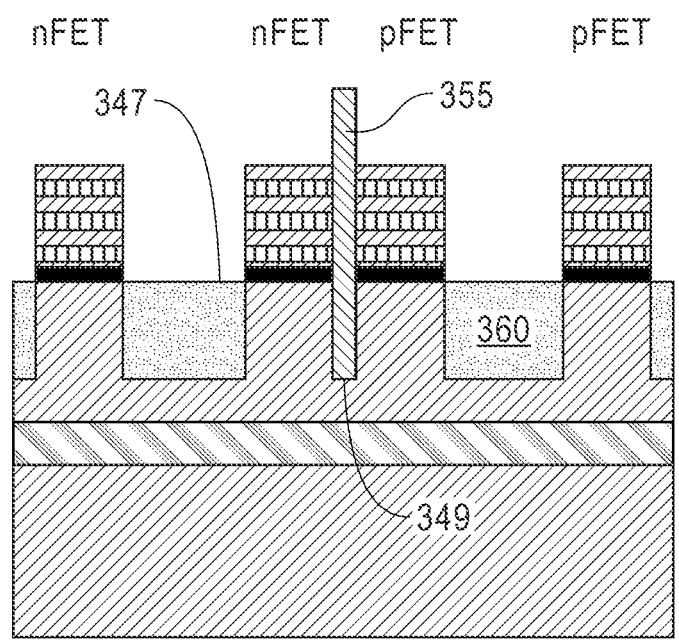
FIG. 9 shows a view of shallow trench isolation formation, according to an embodiment.

FIG. 8 shows a formation after isotopically etching back the liner 355. In some embodiments, the liner 355 is removed from everywhere except the trench 349 between adjacent n-type and p-type FET structures. FIG. 9 shows a formation after forming a shallow trench isolation layer 360 in trenches 347. Embodiments may also remove the placeholder structures 340A and 340B. A section of the liner 355 may extend above the level of the nanosheets after removal of the placeholder structures 340A and 340B and down into the substrate layer 320. As will be seen in coming formations, the liner 355 provides a dielectric barrier separating the NFET side from the PFET side of elements in the fork sheet.

The following figures are shown in three perspectives per the axes defined by the legend in FIG. 2.

FIGS. 10A-10C show a formation after patterning the result from FIG. 9 into structures defining FET elements. As can be seen in FIGS. 10A and 10C, the sacrificial layer 325 has been replaced by a bottom dielectric isolation (BDI) layer 365. The sacrificial layers 330 have been recessed inward and spacer material has replaced the material removed by recess. As shown in FIGS. 10A and 10B, an epitaxial growth of a p-type, source and drain structure 370 has been deposited on the PFET side of the fork sheet. An epitaxial growth of an n-type source and drain structure 375 has been deposited on the NFET side of the fork sheet. As shown in FIGS. 10A and 10C, a dummy gate structure 385 has been formed. As shown in FIGS. 10A and 10B, some embodiments may deposit an interlevel dielectric 380 around the p-type, source and drain structure 370 and n-type, source and drain structure 375. Some embodiments may perform planarization of the top surface of the formation.

FIGS. 11A-11C show replacement of the dummy gate structure 385 with a gate metal (using, for example, a high-K gate metal), forming a gate region 390.

FIGS. 12A-12C show a formation after patterning the middle of line layer using a selective etching process. The process may include etching away interlevel dielectric 380 material from between the n-type, source and drain structure 375 and an adjacent n-type, source and drain structure (called out as 392 in FIG. 12B to distinguish it from the n-type, source and drain structure 375 paired with the p-type, source and drain structure 370). A similar process may be performed on the PFET side. Another section of the interlevel dielectric 380 above the top surface level of the source and drain structure 375 may be removed. The empty space left from the removal of interlevel dielectric 380 defines a cavity that will eventually be used to receive deposition of a conductive contact metal. The span or width of the empty space for the conductive contact may extend from a point on the top surface of source and drain structure 392 to over a point on the top surface of source and drain structure 375. The sidewalls of the empty conductive contact spaces may be sloped. As can be seen in FIG. 12B, the span between sidewalls of the interlevel dielectric 380 separating the NFET side from the PFET side may taper inward toward the peak of the feature.

The tapered structure provides additional space to receive conductive material for the contact which enables to print smaller contacts and thereby increases the NFET to PFET (N2P) tip to tip (T2T) space. As shown in FIG. 12C, some of the interlevel dielectric 380 is removed to form a conductive contact space in connection with the gate region 390.

Figure 13D:
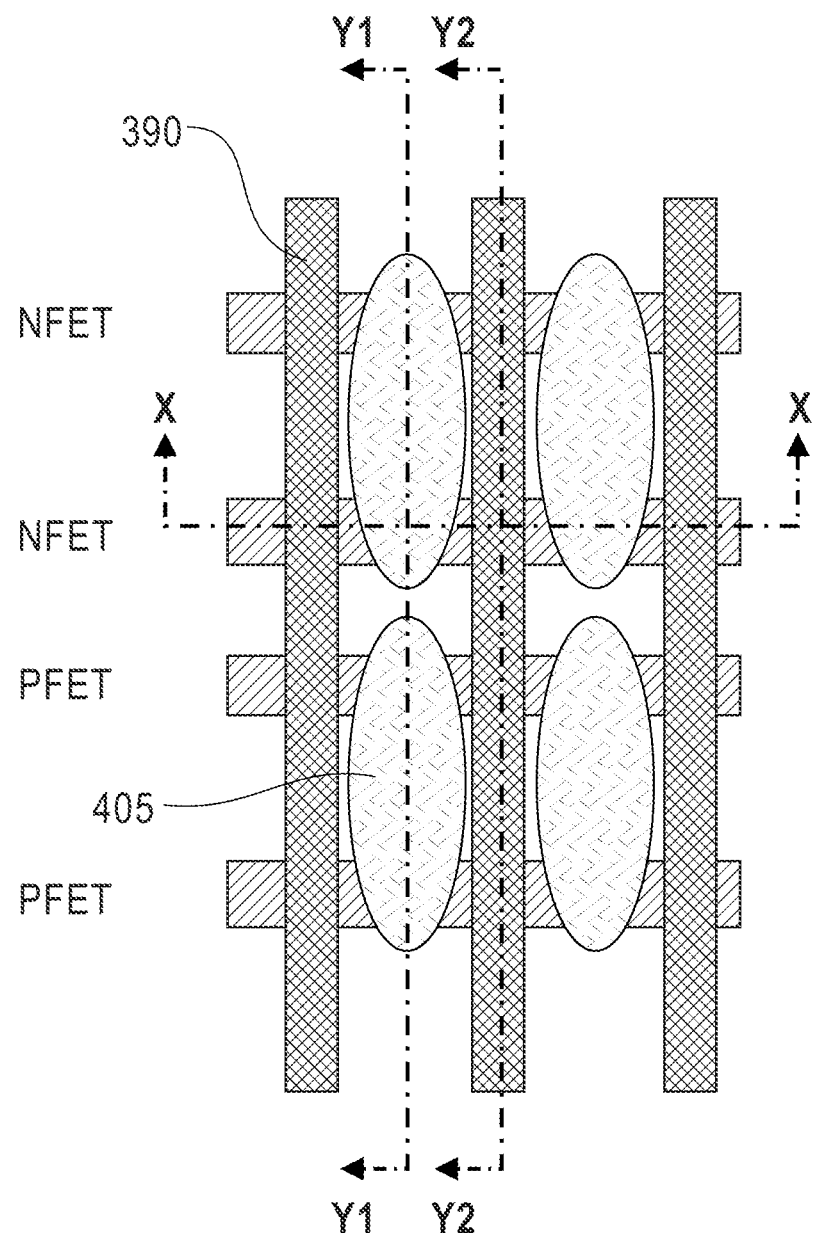
FIG. 13D is a legend showing axes from a top view perspective of the formation shown in FIGS. 13A-13C.

FIGS. 13A-13B show deposition of conductive material into the empty space between and on top of the source and drain structures 375 and 392 to form a first conductive contact 405. Deposition of conductive material is also deposited into the analogous empty spaces on the PFET side to form a second conductive contact in contact with the p-type, source and drain structure 370. FIG. 13C shows deposition of conductive material in the empty space to form a third conductive contact 410 in contact with the gate region 390. FIG. 13D updates the legend shown in FIG. 2 to show relative placement of the conductive contacts that bridge the PFET source and drain structures and conductive contacts 405 that bridge the NFET source and drain structures.

Figure 14D:
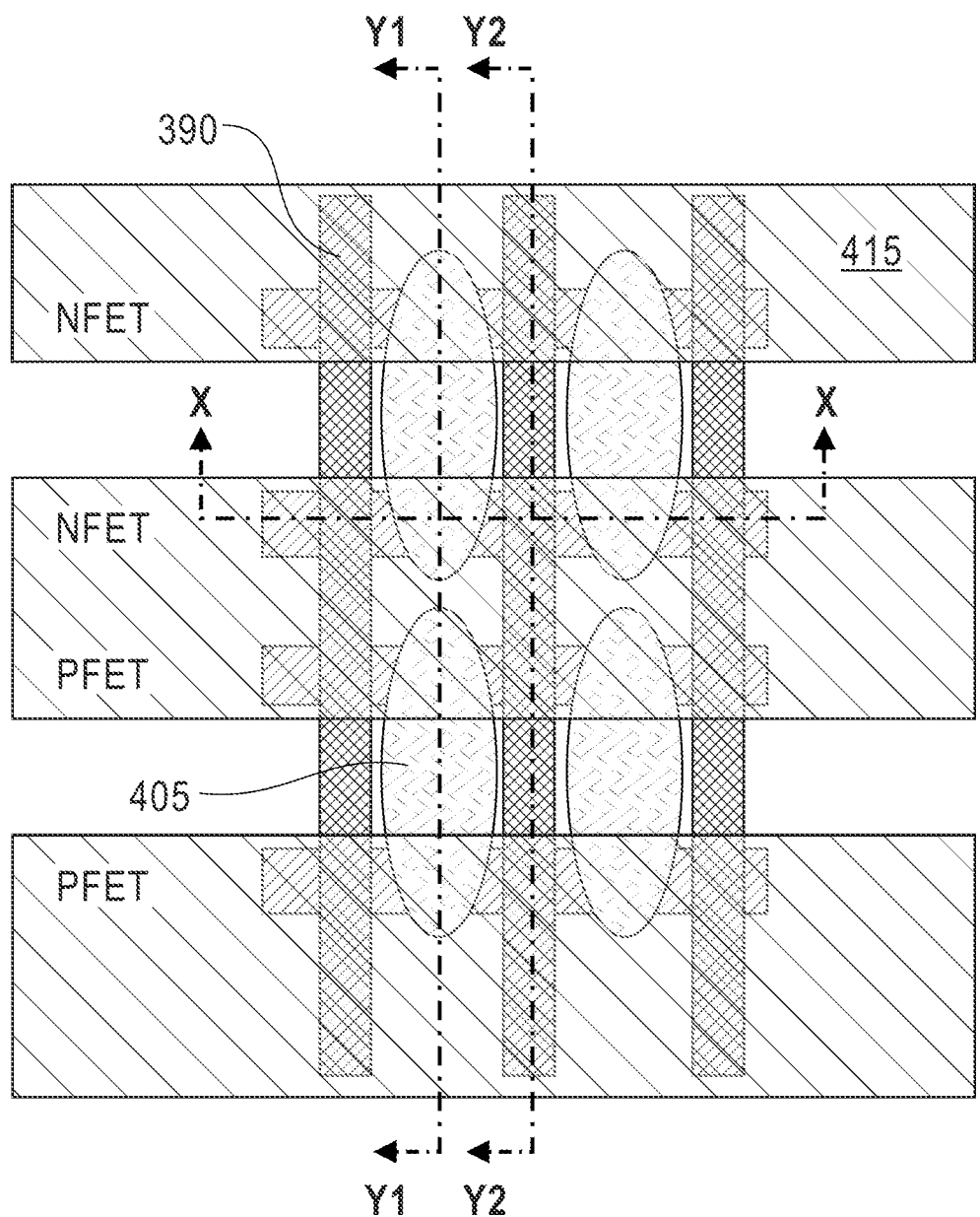
FIG. 14D is a legend showing axes from a top view perspective of the formation shown in FIGS. 14A-14C.

FIGS. 14A-14C show a formation after performing a late cut into the MOL. Some embodiments deposit an organic planarization layer (OPL) 415 over the top surface of the MOL features. The late cut may be performed through the conductive contact 405 and down through the shallow trench isolation layer 360 and into the substrate layer 320 on the NFET side. A similar cut may be performed through analogous structures on the PFET side. FIG. As shown in FIG. 14C, part of the gate region may also be cut into. 14D updates the legend shown in FIG. 13D to show position of the cuts on the NFET and PFET sides and the OPL 415.

Figure 15D:
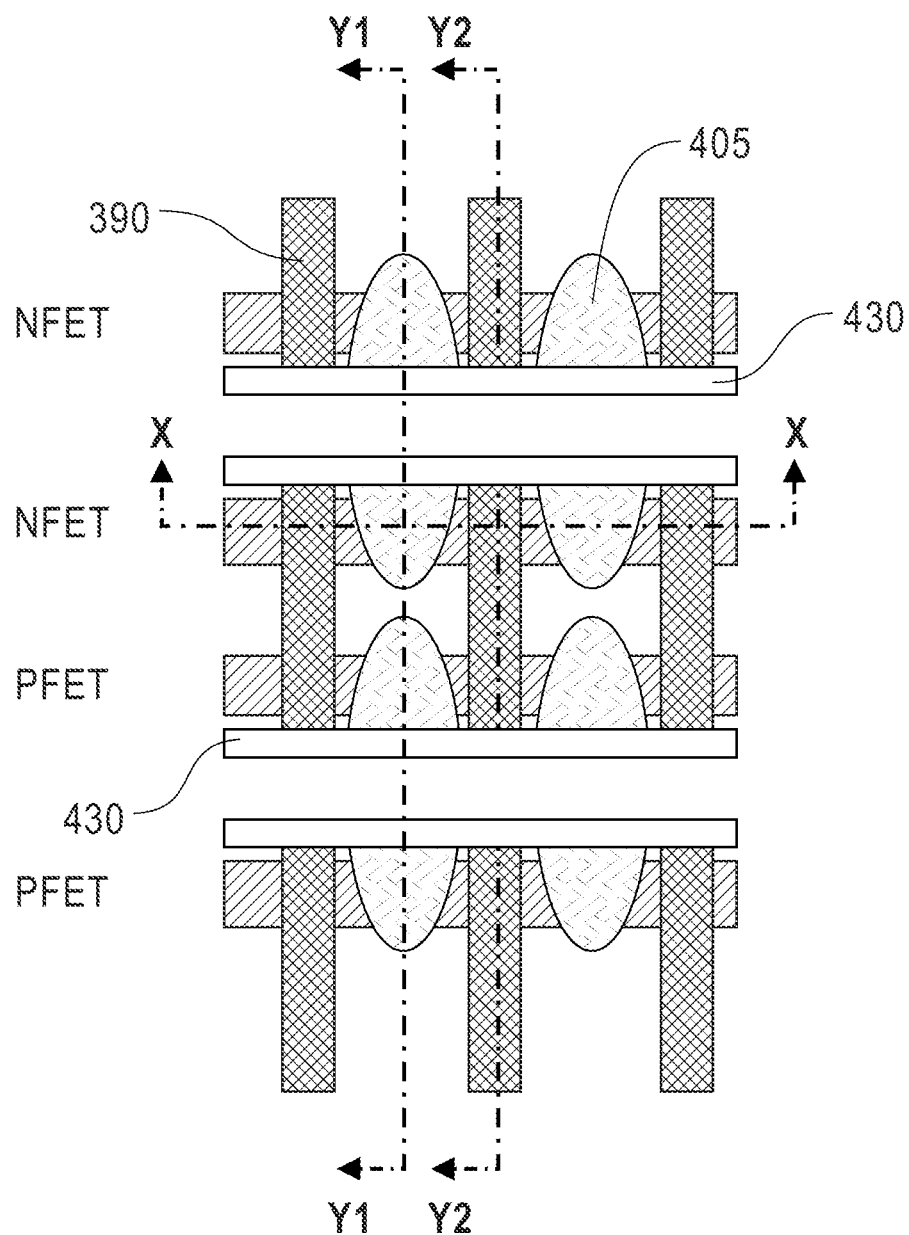
FIG. 15D is a legend showing axes from a top view perspective of the formation shown in FIGS. 15A-15C.

FIGS. 15A-15D show the effect of plasma ashing on the formation shown in FIGS. 14A-14D. The ashing process removes the OPL layer 415. A liner 430 may be deposited to line the inner side walls of the spaces formed by the cut. FIG. 15D updates the legend shown in FIG. 14D to show positioning of the liner 430.

Figure 16D:
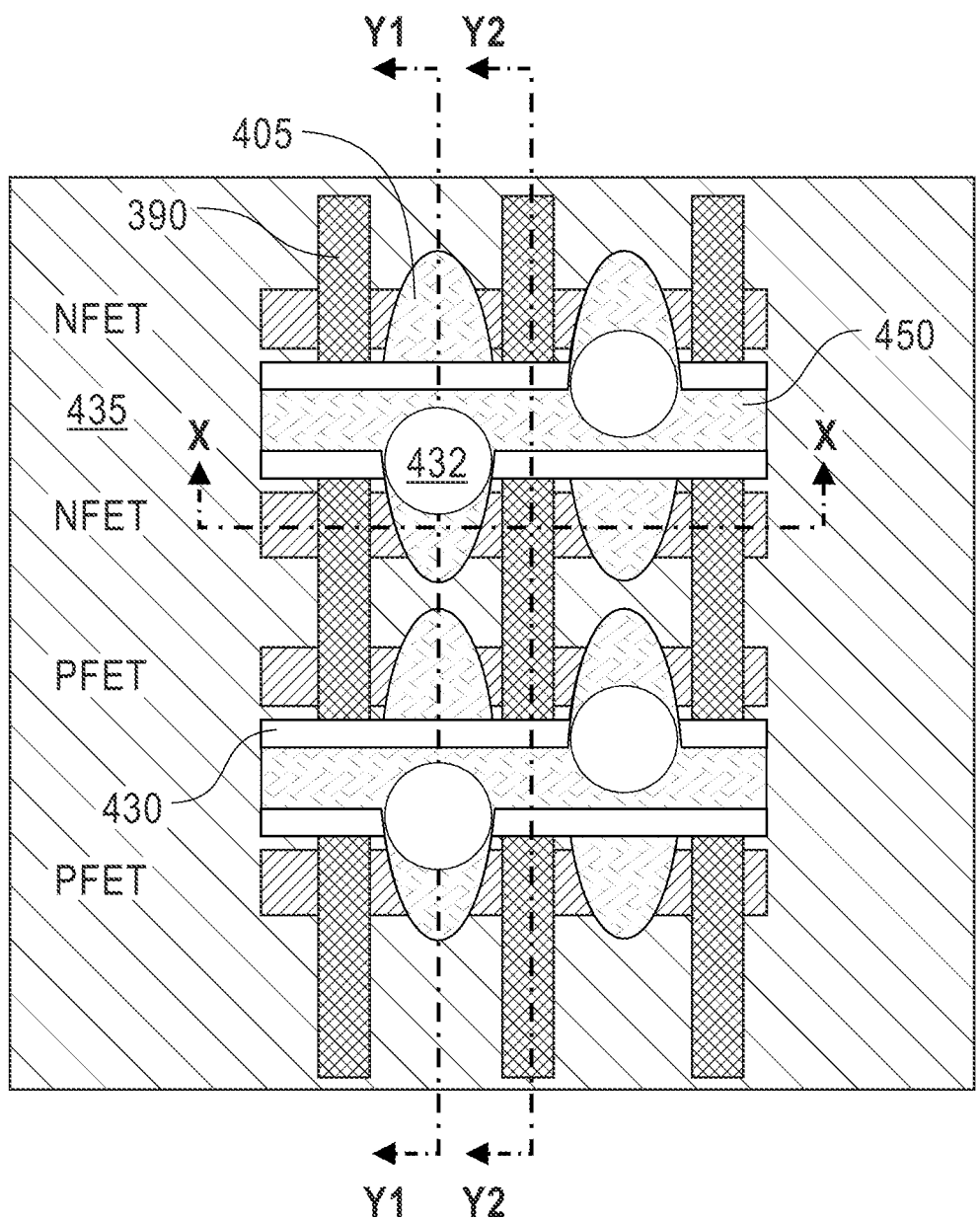
FIG. 16D is a legend showing axes from a top view perspective of the formation shown in FIGS. 16A-16C.
Figure 17D:
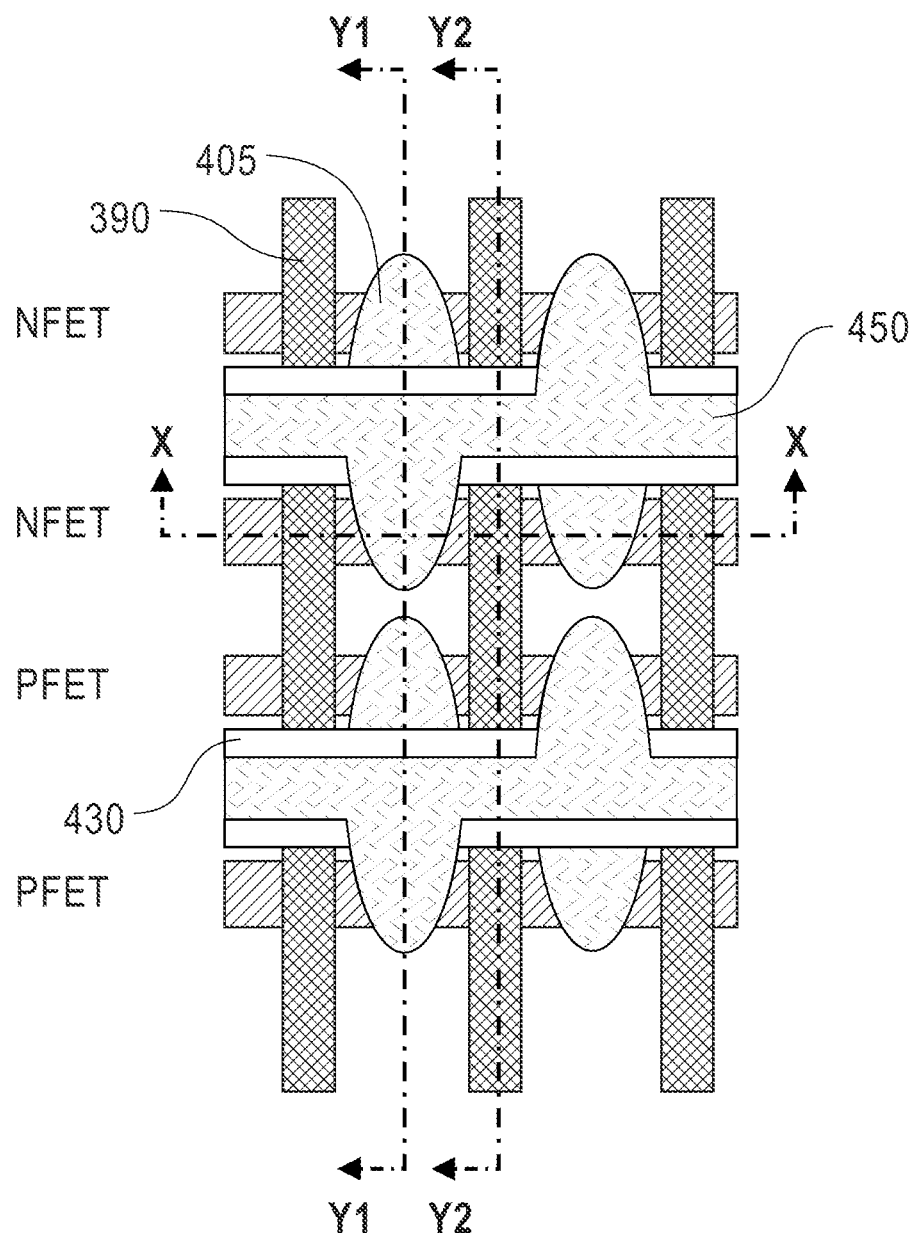
FIG. 17D is a legend showing axes from a top view perspective of the formation shown in FIGS. 17A-17C.

FIGS. 16A-16D show a formation after removing part of the liner 430 using a via backside power rail pattern. As can be seen in FIG. 16B, the pattern used defines an elongated empty space 435 that extends below the top surface of the source and drain structures 370 and 375. Some of the pattern opens up a cavity 432 above the conductive contacts. FIG. 16D updates the legend shown in 15D to show positions of the cavities 432. FIGS. 17A-17D show deposition of metal into the empty space 435 and cavity 432 (see FIGS. 16A-16D) to form a power bar 450 connected to the conductive contact 405 (and similarly a power bard is formed from the conductive contact on the PFET side). As can be seen, the power bar 450 extends just short of the etch stop layer which will define the back side surface of the MOL in later steps. FIG. 17D updates the legend shown in FIG. 16D to show positioning of the power bars 450.

FIGS. 18A-18D show the formation of a BEOL 460 on the top surface of the MOL, over the fork sheet FET. Some embodiments may form a carrier wafer 465 on top of the BEOL 460.

Figure 19A:
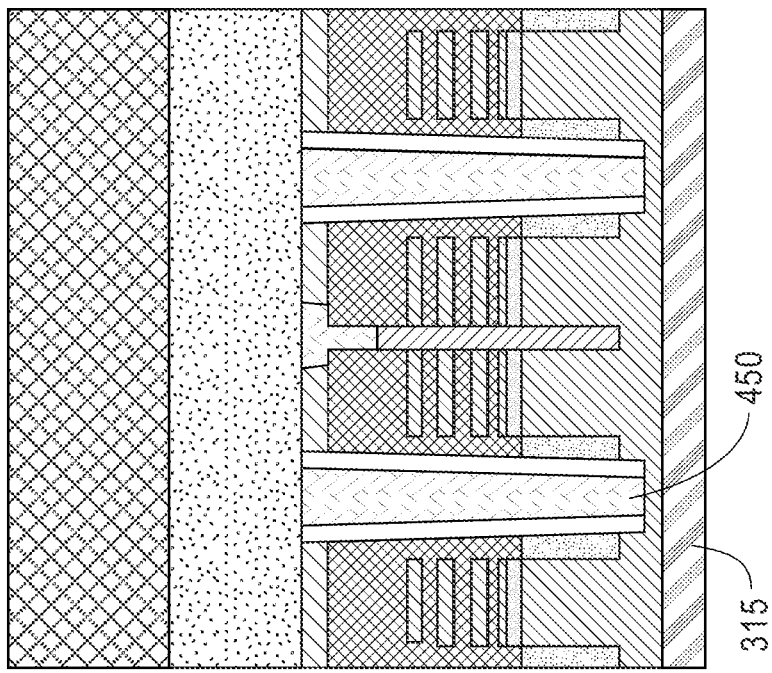
FIGS. 19A-19C show views after a wafer flip and removal of a substrate, according to an embodiment.
Figure 19B:
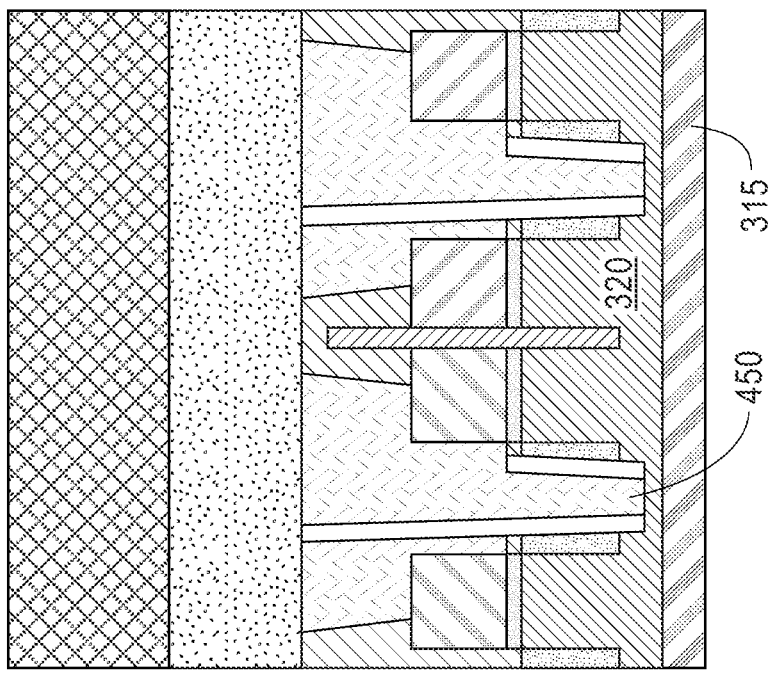
Figure 19C:
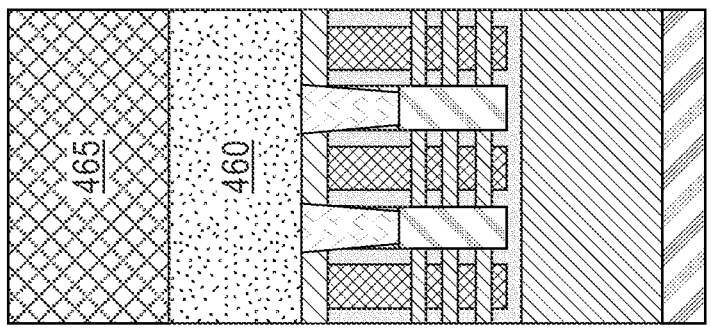

FIGS. 19A-19C show formation of the device after a wafer flip and removal of the substrate layer 310 (called out in FIG. 3). It will be understood that the orientation is kept consistent with the formation shown in FIGS. 18A-18C for sake of illustration even though the process is occurring on the back side of the device. FIGS. 20A-20C show a formation after removal of the etch stop layer 315 and recessing of the substrate layer 320 (shown in FIGS. 19A-19C). FIGS. 21A-21C show the result of a back side deposition of an interlevel dielectric 470. Back side power rails 480 (which may be $V_{DD}$) and back side power rails 485 (which may be the Vss) may be formed. The back side power rails 480 may be connected to the power bars 450. Some embodiments may form a back side power delivery network 475 on the back side of the MOL in connection with the power rails 480 and 485. The embodiment shown in FIGS. 21A-21C is similar to the embodiment described in FIGS. 1A-1D.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits, and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A microelectronic device, comprising:
a first source and drain structure adjacent to a second source and drain structure;
a first conductive contact in contact with a top surface and a side surface of the first source and drain structure;
a second conductive contact in contact with a top surface and a side surface of the second source and drain structure, wherein the second conductive contact includes a via extension to connect to a backside component; and
a separating layer located between the first conductive contact and the second conductive contact, wherein:
a first sidewall of the separating layer is flush with the first conductive contact; and
a second sidewall of the separating layer is flush with the second conductive contact.

2. The microelectronic device of claim 1, further comprising a power bar coupled to the first conductive contact and to a backside power rail.

3. The microelectronic device of claim 1, wherein a backside power rail is connected to a backside power delivery network.

4. The microelectronic device of claim 1, wherein the first conductive contact is wrapped around the first source and drain structure.

5. The microelectronic device of claim 1, wherein the first source and drain structure and the second source and drain structure cooperate to form a fork sheet FET.

6. The microelectronic device of claim 1, wherein the first source and drain structure is an NFET and the second source and drain structure is a PFET.

7. The microelectronic device of claim 1, further comprising a gate region, wherein the separating layer includes a dielectric configured separate the gate region from the first source and drain structure, and from the second source and drain structure.

8. The microelectronic device of claim 7, further comprising a third conductive contact in contact with the gate region.

9. The microelectronic device of claim 8, further comprising a back end of line layer in contact with the first conductive contact, the second conductive contact, and the third conductive contact.

10. A semiconductor device, comprising:
a middle of line layer;
a back end of line layer coupled to a front side of the middle of line layer;
a backside power delivery network coupled to a back side of the middle of line layer;
a power rail in the backside power delivery network;
a fork sheet FET positioned in the middle of line layer, including a first source and drain structure adjacent to a second source and drain structure, wherein the fork sheet FET includes a dielectric liner, a first plurality of nanosheets, a second plurality of nanosheets, wherein the first plurality of nanosheets are located on and in direct contact with a first side of the dielectric liner, wherein the second plurality of nanosheet are located on and in direct contact with a second side of the dielectric liner, wherein the first side of the liner is in direct contact with gate material that located around the first plurality of nanosheets, and wherein the second side of the liner is in contact with gate material that surrounds the second plurality of nanosheets;
a first conductive contact in contact with the first source and drain structure and with the back end of line layer; and
a power bar in the middle of line layer in contact with the first conductive contact and with the power rail in the backside power delivery network.

11. The semiconductor device of claim 10, wherein the first conductive contact is wrapped around the first source and drain structure.

12. The semiconductor device of claim 10, wherein the first conductive contact is in contact with a top surface of the first source and drain structure.

13. The semiconductor device of claim 10, further comprising a second conductive contact in contact with the second source and drain structure.

14. The semiconductor device of claim 10, further comprising a gate region in the middle of line layer and a third conductive contact in contact with the gate region.

15. A method of manufacturing a semiconductor device, comprising:
    forming, from a semiconductor substrate, a pair of field effect transistors (FETs) that is configured in a fork sheet configuration, wherein the fork sheet configuration includes a dielectric liner, a first plurality of nanosheets, a second plurality of nanosheets, wherein the first plurality of nanosheets are located on and in direct contact with a first side of the dielectric liner, wherein the second plurality of nanosheet are located on and in direct contact with a second side of the dielectric liner, wherein the first side of the liner is in direct contact with gate material that located around the first plurality of nanosheets, and wherein the second side of the liner is in contact with gate material that surrounds the second plurality of nanosheets;
    forming a dielectric separation layer in between the pair of FETs;
    forming a gate region proximate the pair of FETs;
    forming a power bar in contact with a first of the pair of FETs in a middle of line layer of the semiconductor device;
    forming a first conductive contact in contact with the power bar from a front side of the middle of line layer;
    forming a power rail in contact with the power bar, on a back side of the middle of line layer; and
    forming a back side power delivery network on the back side of the middle of line layer.

16. The method of claim 15, further comprising forming the first conductive contact in contact with a top surface of the first of the FETs.

17. The method of claim 15, further comprising forming the first conductive contact wrapped around a source and drain structure of the first of the FETs.

18. The method of claim 15, further comprising forming a second conductive contact in contact with a second of the FETs, wherein the dielectric separation layer is formed separating the second conductive contact from the first conductive contact.

19. The method of claim 18, further comprising:
    forming an n-type source and drain in the first of the FETs and forming a p-type source and drain in the second of the FETs or;
    forming a p-type source and drain in the first of the FETs and forming an n-type source and drain in the second of the FETs.

* * * * *